United States Patent
Takahashi

(10) Patent No.: US 7,317,643 B2
(45) Date of Patent: Jan. 8, 2008

(54) SEMICONDUCTOR MEMORY DEVICE

(75) Inventor: Takeo Takahashi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 81 days.

(21) Appl. No.: 11/346,379

(22) Filed: Feb. 3, 2006

(65) Prior Publication Data

US 2006/0187725 A1    Aug. 24, 2006

(30) Foreign Application Priority Data

Feb. 4, 2005    (JP) .............................. 2005-029628

(51) Int. Cl.
*G11C 7/00*    (2006.01)

(52) U.S. Cl. .................................. 365/189.11; 365/94

(58) Field of Classification Search ........... 365/189.11, 365/94, 189.09
See application file for complete search history.

(56) References Cited

U.S. PATENT DOCUMENTS 5,303,194 A * 4/1994 Suzuki ........................ 365/203

5,528,534 A * 6/1996 Shoji .......................... 365/104

FOREIGN PATENT DOCUMENTS

JP    2000-90685    3/2000

* cited by examiner

*Primary Examiner*—Anh Phung
(74) *Attorney, Agent, or Firm*—Nixon Peabody LLP; Donald R. Studebaker

(57) ABSTRACT

Disclosed herein is a semiconductor memory device which prevents the voltage of a select bit line from being reduced due to the action of coupling capacitance between the select bit line and a non-select bit line and reduces current consumption in the non-select bit line. The semiconductor memory device includes a memory cell array, a plurality of word lines, a plurality of bit lines, a data line, a plurality of selector circuits, at least one precharge circuit, and at least one pull-down circuit. The selector circuits switch electrical connections and isolations between the respective bit lines and the data line. The precharge circuit precharges the select bit line to a predetermined voltage level which is different from a voltage level of a first voltage line. The pull-down circuit pulls the select bit line down to the voltage level of the first voltage line.

17 Claims, 15 Drawing Sheets

PRIOR ART

SEMICONDUCTOR MEMORY DEVICE

BACKGROUND OF THE INVENTION

1. Field of the Invention

The present invention relates to a semiconductor memory device, such as a mask read only memory (ROM).

2. Description of the Related Art

Known as a semiconductor memory device is, for example, a mask ROM. The mask ROM is a read only semiconductor memory device in which values to be stored are written in memory cells in a manufacturing process.

A read circuit of a conventional mask ROM will hereinafter be described with reference to FIG. 1.

A memory cell array 100 includes a plurality of memory cell transistors T11 to Tmn. The memory cell transistors T11 to Tmn have gates connected to word lines WL1 to WLm arranged in rows. The memory cell transistors T11 to Tmn also have drains connected to bit lines BL1 to BLn arranged in columns.

Some of the memory cell transistors T11 to Tmn have sources connected to a first voltage line which is at a ground voltage level (GND level), namely, grounded. The other memory cell transistors have sources which are in a floating state. In FIG. 1, the sources of the memory cell transistors T12, T1n, T21, Tm1 and Tmn are at the GND level, and the sources of the memory cell transistors T11, T22, T2n and Tm2 are in the floating state (denoted by a character F in this figure). Values to be stored are written according to the connection states of the sources of the corresponding memory cell transistors, namely, according to whether those sources are grounded or float.

For example, voltages to be read (also referred to hereinafter as "read voltages") from the memory cell transistors T11 to Tmn may be set to a low level by grounding the sources of the memory cell transistors T11 to Tmn. On the contrary, the read voltages of the memory cell transistors T11 to Tmn may be set to a high level by allowing the sources of the memory cell transistors T11 to Tmn to float.

Selector circuits 110-1 to 110-n and precharge circuits 130-1 to 130-n are connected to the bit lines BL1 to BLn, respectively.

The selector circuits 110-1 to 110-n are composed of, for example, pMOS transistors (shortly referred to hereinafter as "pMOSs") 122-1 to 122-n, respectively. The pMOSs 122-1 to 122-n have sources connected respectively to the bit lines BL1 to BLn and drains connected in common to a data line DL. When select signals (denoted by arrows S1-1 to S1-n in this figure) inputted respectively to the gates of the pMOSs 122-1 to 122-n are low in level, the pMOSs 122-1 to 122-n are turned on to electrically connect the bit lines BL1 to BLn with the data line DL, respectively. On the contrary, when the select signals S1-1 to S1-n are high in level, the pMOSs 122-1 to 122-n are turned off to electrically isolate the bit lines BL1 to BLn from the data line DL, respectively. In the following description, it is assumed that the selector circuits 110-1 to 110-n are turned on when the pMOSs 122-1 to 122-n thereof are turned on, and off when the pMOSs 122-1 to 122-n are turned off.

The precharge circuits 130-1 to 130-n include, for example, pMOSs 142-1 to 142-n and inverting circuits 144-1 to 144-n, respectively. The pMOSs 142-1 to 142-n have sources connected in common to a second voltage line which is at a supply voltage level (VDD level), and drains connected respectively to the bit lines BL1 to BLn. The select signals S1-1 to S1-n are inverted by the inverting circuits 144-1 to 144-n and then inputted to the pMOSs 142-1 to 142-n, respectively. As a result, when the select signals S1-1 to S1-n are high in level, the pMOSs 142-1 to 142-n are turned on to apply the supply voltage VDD to the bit lines BL1 to BLn, respectively, thereby causing the bit lines BL1 to BLn to assume the VDD level, or high level. On the other hand, when the select signals S1-1 to S1-n are low in level, the pMOSs 142-1 to 142-n are turned off. In the following description, it is assumed that the precharge circuits 130-1 to 130-n are turned on when the pMOSs 142-1 to 142-n thereof are turned on, and off when the pMOSs 142-1 to 142-n are turned off.

A read operation of the conventional mask ROM with the above-mentioned configuration will hereinafter be described with reference to FIGS. 2A to 2D.

In the initial state of every read cycle, all the select signals S1-1 to S1-n are set to a high level. At this time, the selector circuits 110-1 to 110-n are turned off, whereas the precharge circuits 130-1 to 130-n are turned on, so the bit lines BL1 to BLn assume the VDD level. Also, the word lines WL1 to WLm are set to the GND level, thereby causing all the memory cell transistors T11 to Tmn to be turned off.

A description will hereinafter be given of the case of reading a stored value of the memory cell transistor T11 set to a high-level read mode. For reading of the memory cell transistor T11, the bit line BL1 and the word line WL1 are selected.

When the bit line BL1 is selected, at a time t11, the select signal S1-1 becomes low in level and the other select signals S1-2 to S1-n are held at a high level. At this time, the precharge circuit 130-1 is turned off and the selector circuit 110-1 is turned on. As a result, the selected bit line (also referred to hereinafter as a "select bit line") BL1 and the data line DL are electrically connected with each other, so as to have the same voltage level.

When the word line WL1 is selected, at a time t12, the selected word line WL1 is set to the VDD level, which is the level of a drive voltage of the memory cell transistor, and the other word lines WL2 to WLm are set to the GND level. If the word line WL1 becomes high in level, all the memory cell transistors T11 to T1n connected to the word line WL1 are turned on. In contrast, all the memory cell transistors T21 to Tmn connected to the other word lines WL2 to WLm remain off. Because the source of the memory cell transistor T11 is in the floating state, the bit line BL1 remains high in level although the memory cell transistor T11 is turned on. Accordingly, in a read period from the time t12 until a time t13, the voltage of the data line DL is VDD, so as to be outputted as a high-level signal (see FIG. 2A).

Next, a description will be given of the case of reading a stored value of the memory cell transistor T21 set to a low-level read mode. For reading of the memory cell transistor T21, the bit line BL1 and the word line WL2 are selected.

When the bit line BL1 is selected, at the time t11, the select signal S1-1 becomes low in level and the other select signals S1-2 to S1-n are held at a high level. At this time, the precharge circuit 130-1 is turned off and the selector circuit 110-1 is turned on. As a result, the selected bit line BL1 and the data line DL are electrically connected with each other, so as to have the same voltage level.

When the word line WL2 is selected, at the time t12, the selected word line WL2 is set to the VDD level and the other word lines WL1 and WL3 to WLm are set to the GND level.

If the voltage of the word line WL2 is VDD, all the memory cell transistors T21 to T2n connected to the word line WL2 are turned on. In contrast, all the memory cell transistors T11 to T1n and T31 to Tmn connected to the other word lines WL1 and WL3 to WLm remain off. Because the source of the memory cell transistor T21 is grounded, the voltage of the bit line BL1 gradually falls due to through-current between the source and drain of the memory cell transistor T21 if the memory cell transistor T21 is turned on. As a result, in the read period from the time t12 until the time t13, the voltage of the data line DL, electrically connected with the bit line BL1, also gradually falls, so it is outputted as a low-level signal (see FIG. 2B).

Meanwhile, because the memory cell transistor T12 connected to the bit line (also referred to hereinafter as a "non-select bit line") BL2, not selected when the memory cell transistor T11 is read, is turned on, through-current flows between the source and drain of the memory cell transistor T12, thereby causing charges stored on the bit line BL2 to be discharged to the first voltage line. At this time, since the select signal S1-2 is high in level, the precharge circuit 130-2 is turned on so as to supply current to the bit line BL2. As a result, the voltage of the bit line BL2 is stabilized at a value slightly lower than VDD (see FIG. 2C).

Also, when the memory cell transistor T21 is read, the bit line BL2 is held at VDD because the source of the memory cell transistor T22 is in the floating state although the memory cell transistor T22 is turned on (see FIG. 2D).

As aforementioned, in the read circuit of the conventional mask ROM, a non-select bit line is supplied with current by a corresponding precharge circuit, so that it is held at VDD or a value slightly lower than VDD, thereby making it possible to prevent the voltage of a select bit line from being reduced.

For example, when the memory cell transistor T11 is read, the memory cell transistor T12 is in its on state. For this reason, provided that no current is supplied to the bit line BL2 because the corresponding precharge circuit 130-2 is not provided, the voltage of the bit line BL2 will be reduced due to through-current between the source and drain of the memory cell transistor T12.

If the voltage of the bit line BL2 is reduced, the voltage of the bit line BL1 may be reduced by the action of coupling capacitance between the bit line BL1 and the bit line BL2. This reduction in the voltage of the bit line BL1 may result in misreading of the voltage of the bit line BL1, namely, the stored value of the memory cell transistor T11.

For this reason, the read circuit of the mask ROM holds the voltages of non-select bit lines at VDD or a value slightly lower than VDD using the precharge circuits 130-1 to 130-n.

An example of the ROM read circuit is disclosed in Japanese Patent Kokai No. 2000-90685 (Patent Document 1).

However, in the above-mentioned conventional mask ROM read circuit, because transistors, set to the low-level read mode (grounded state) and connected to non-select bit lines and a selected word line, are turned on, power consumption is increased due to through-currents flowing between the sources and drains of the transistors. Particularly, when there are a large number of bit lines, a big problem occurs in peak current in that through-currents flow through all memory cell transistors of the low-level read mode connected to a selected word line.

SUMMARY OF THE INVENTION

Therefore, the present invention has been made in view of the above problems, and it is an object of the present invention to provide a semiconductor memory device having a read circuit for preventing the voltage of a select bit line from being reduced due to the action of coupling capacitance between the select bit line and a non-select bit line and reducing current consumption.

In accordance with the present invention, the above and other objects can be accomplished by the provision of a semiconductor memory device comprising a memory cell array, a plurality of word lines, a plurality of bit lines, a data line, a plurality of selector circuits, at least one precharge circuit, and at least one pull-down circuit.

The memory cell array includes a plurality of memory cell transistors arranged in matrix form. Each of the memory cell transistors has a first main electrode, a second main electrode and a control electrode. Each of the memory cell transistors is written with a stored value depending on whether a connection is made between the first main electrode thereof and a first voltage line.

The word lines are connected to the control electrodes of the memory cell transistors of corresponding rows of the memory cell array, respectively. The bit lines are connected to the second main electrodes of the memory cell transistors of corresponding columns of the memory cell array, respectively.

The data line selectively outputs voltages of the bit lines.

Each of the selector circuits is installed between a corresponding one of the bit lines and the data line. Each of the selector circuits electrically connects the corresponding bit line with the data line when a select signal inputted thereto assumes a select level, and electrically isolates the corresponding bit line from the data line when the inputted select signal assumes a non-select level.

The precharge circuit is connected to a first input signal line which transfers a common first input signal having any one of a first active level and a first inactive level. The precharge circuit precharges the bit lines to a predetermined voltage level which is different from a voltage level of the first voltage line.

The pull-down circuit is connected to a second input signal line which transfers a common second input signal having any one of a second active level and a second inactive level. The pull-down circuit pulls the bit lines down to the voltage level of the first voltage line.

The semiconductor memory device of the present invention comprises the pull-down circuit to set the bit lines to the voltage level, for example, a ground voltage level (GND level), of the first voltage line. Therefore, non-select bit lines can be held at the GND level. Since the non-select bit lines remain at the GND level, not changed, a select bit line is not subject to a voltage reduction resulting from the action of coupling capacitance between the select bit line and the non-select bit lines. That is, it is possible to prevent misreading of a stored value from the select bit line.

In addition, because the non-select bit lines are held at the GND level, it is possible to reduce current consumption in the non-select bit lines.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
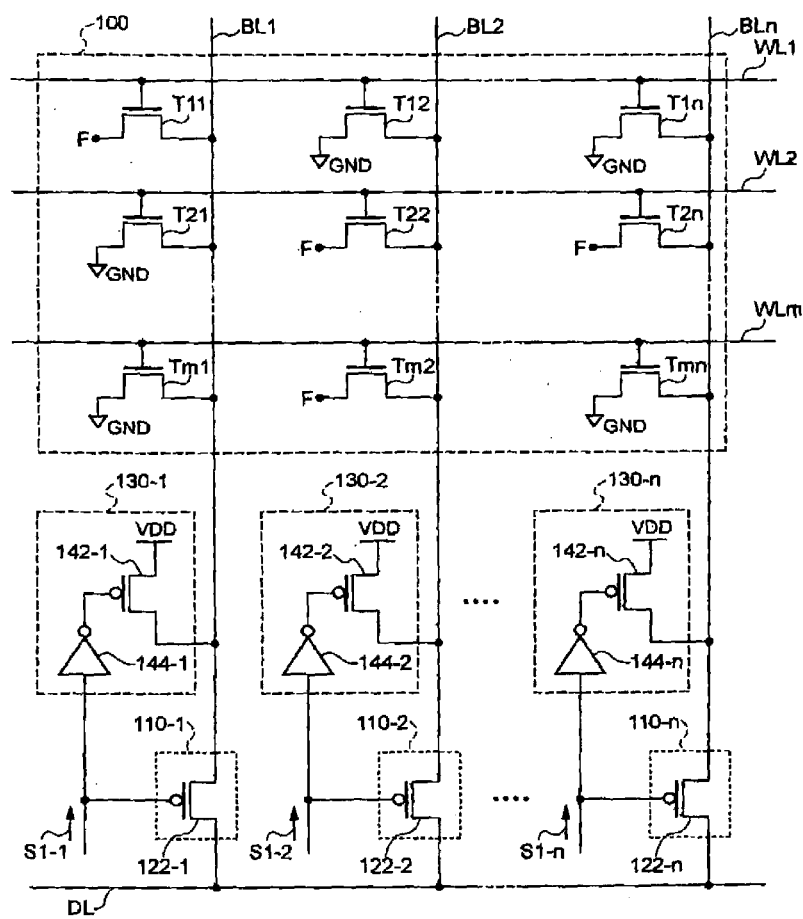
FIG. 1 is a circuit diagram schematically showing the configuration of a conventional semiconductor memory device.
Figure 2A:
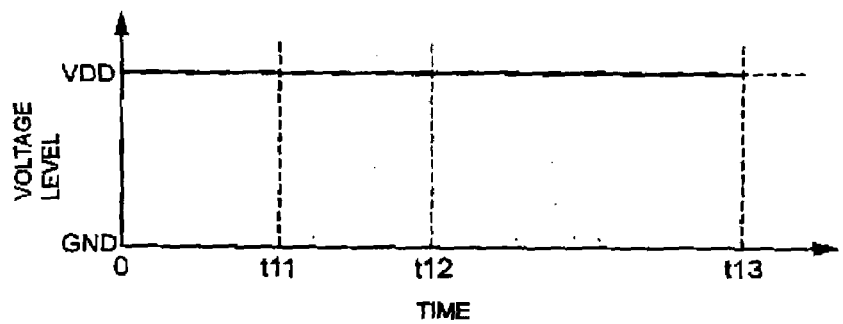
FIGS. 2A to 2D are views illustrating the operation of the conventional semiconductor memory device.
Figure 2B:
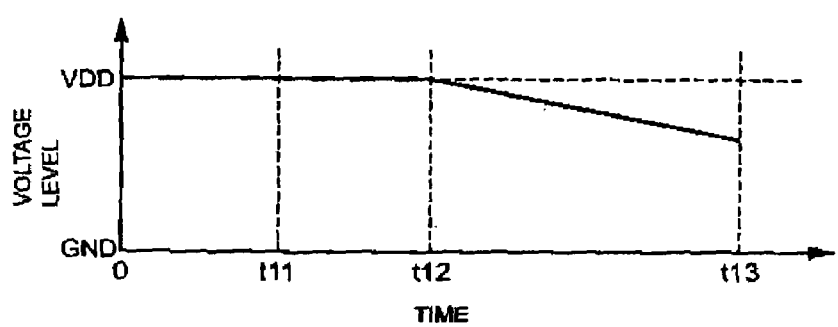
Figure 2C:
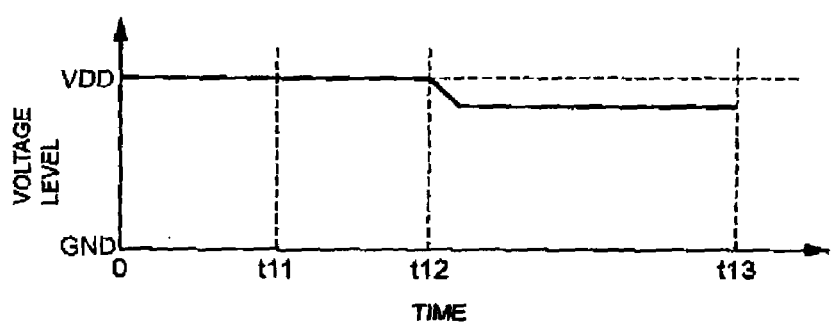
Figure 2D:
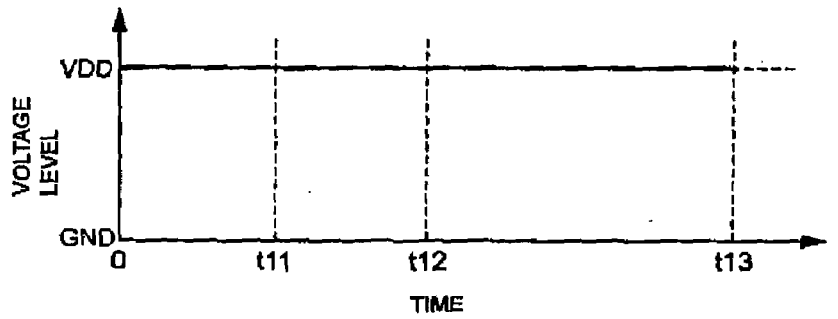

Reference will now be made in detail to the preferred embodiments of the present invention, examples of which are illustrated in the accompanying drawings, wherein like reference numerals refer to like elements throughout and the structures and arrangements of respective constituent elements are shown so schematically that those skilled in the art can understand the present invention. The embodiments are described below to explain the present invention by referring to the figures. These embodiments are nothing but preferred examples, and the present invention is not limited thereto.

Figure 3:
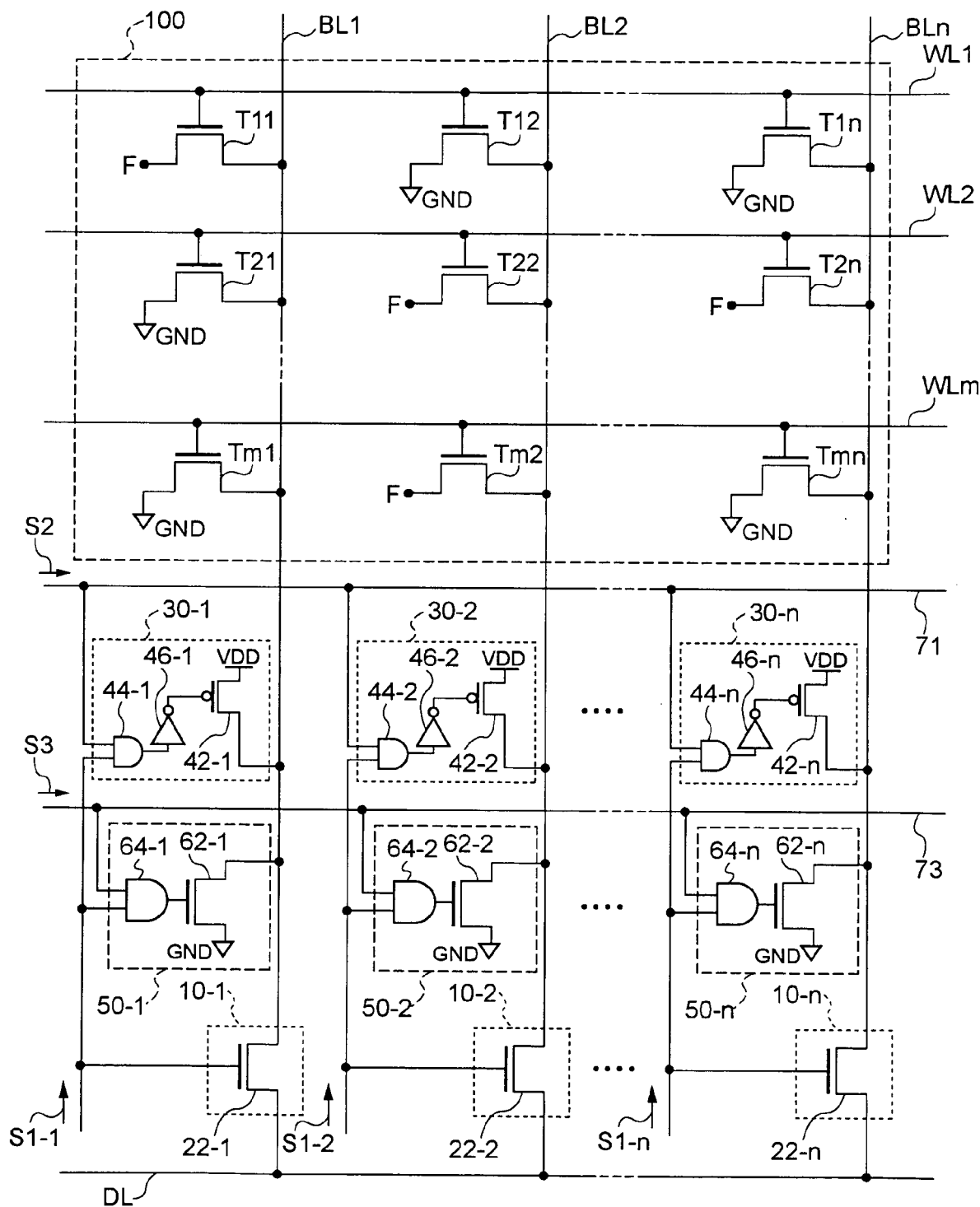
FIG. 3 is a circuit diagram schematically showing the configuration of a mask ROM, which is a semiconductor memory device according to a first embodiment of the present invention.

Configuration of First Embodiment and Basic Operations of Respective Parts Thereof FIG. 3 is a circuit diagram schematically showing the configuration of a mask ROM, which is a semiconductor memory device according to a first embodiment of the present invention.

The mask ROM comprises a memory cell array 100, m word lines WL1 to WLm, n bit lines BL1 to BLn, one data line DL, n selector circuits 10-1 to 10-$n$, n precharge circuits 30-1 to 30-$n$, and n pull-down circuits 50-1 to 50-$n$. Here, m and n are natural numbers which are greater than or equal to 2.

The memory cell array 100 includes mxn memory cell transistors T11 to Tmn arranged in matrix form. In the present embodiment, nMOS transistors (also referred to hereinafter as "nMOSs") are used as the memory cell transistors T11 to Tmn.

In a manufacturing process, values to be stored are written in the memory cell transistors T11 to Tmn according to whether first main electrodes, or sources, of the memory cell transistors T11 to Tmn are connected to a first voltage line which is at a ground voltage level (also referred to hereinafter as a "GND level"), namely, according to whether connections are made between the sources and the first voltage line.

When the sources of the memory cell transistors T11 to Tmn are connected to the first voltage line of the GND level, namely, when they are grounded, read voltages of the memory cell transistors T11 to Tmn assume a low level. Alternatively, when the sources of the memory cell transistors T11 to Tmn are not connected to the first voltage line, namely, when they are in a floating state (denoted by a character F in this figure), the read voltages of the memory cell transistors T11 to Tmn assume a high level. Here, it is assumed that the memory cell transistors T12, T1$n$, T21, Tm1 and Tmn are set to a low-level read mode and the memory cell transistors T11, T22, T2$n$ and Tm2 are set to a high-level read mode.

The m word lines WL1 to WLm are installed in the rows of the memory cell array 100, respectively. The word lines WL1 to WLm are connected to control electrodes, or gates, of the memory cell transistors T11 to Tmn of the corresponding rows, respectively. The n bit lines BL1 to BLn are installed in the columns of the memory cell array 100, respectively. The bit lines BL1 to BLn are connected to second main electrodes, or drains, of the memory cell transistors T11 to Tmn of the corresponding columns, respectively.

Each of the selector circuits 10-1 to 10-$n$ is disposed between a corresponding one of the bit lines BL1 to BLn and the data line DL. Inputted to each of the selector circuits 10-1 to 10-$n$ is a corresponding one of select signals S1-1 to S1-$n$ that can selectively have, namely, assume two voltage levels, a select level and a non-select level. When the select signals S1-1 to S1-$n$ assume the select level, the selector circuits 10-1 to 10-$n$ electrically connect the bit lines BL1 to BLn with the data line DL, respectively. On the contrary, when the select signals S1-1 to S1-$n$ assume the non-select level, the selector circuits 10-1 to 10-$n$ electrically isolate the bit lines BL1 to BLn from the data line DL, respectively. The bit lines BL1 to BLn become select bit lines when they are electrically connected with the data line DL, and non-select bit lines when they are electrically isolated from the data line DL. In the present embodiment, nMOSs 22-1 to 22-n are used as the n selector circuits 10-1 to 10-n. The nMOSs 22-1 to 22-n have drains connected respectively to the bit lines BL1 to BLn and sources connected in common to the data line DL. The select signals S1-l to S1-n are inputted to the gates of the nMOSs 22-1 to 22-n, respectively. Here, it is assumed that the select level of the select signals S1-1 to S1-n is a high level (H), for example, the same level as that of a drive voltage VDD of the transistors, and the non-select level thereof is a low level (L), for example, the GND level.

When any one, for example, the select signal S1-2, of the select signals S1-i to S1-n inputted to the selector circuits 10-1 to 10-n is high in level and the remaining select signals S1-1 and S1-3 to S1-n are low in level, the voltage level of the data line DL becomes the same as that of the bit line BL2. At this time, the data line DL can output the voltage of the bit line BL2. As a result, when one select signal assumes the select level and the other select signals assume the non-select level, the data line DL selectively outputs the voltage of one bit line selected from among the n bit lines BL1 to BLn.

In the following description, it is assumed that the selector circuits 10-1 to 10-n are turned on when the nMOSs 22-1 to 22-n thereof are turned on, and off when the nMOSs 22-1 to 22-n are turned off.

The precharge circuits 30-1 to 30-n are connected respectively to the bit lines BL1 to BLn in a one-to-one relationship. The precharge circuits 30-1 to 30-n are also connected in common to a first input signal line 71 over which a first input signal (denoted by an arrow S2 in this figure) is transferred. The first input signal S2 has any one of two voltage levels, a first active level and a first inactive level. The precharge circuits 30-1 to 30-n can precharge the bit lines BL1 to BLn connected respectively thereto (namely, precharge the bit lines BL1 to BLn to a predetermined voltage level).

The pull-down circuits 50-1 to 50-n are connected respectively to the bit lines BL1 to BLn in a one-to-one relationship. The pull-down circuits 50-1 to 50-n are also connected in common to a second input signal line 73 over which a second input signal (denoted by an arrow S3 in this figure) is transferred. The second input signal S3 has any one of two voltage levels, a second active level and a second inactive level. The pull-down circuits 50-1 to 50-n can pull down the bit lines BL1 to BLn connected respectively thereto (namely, pull the bit lines BL1 to BLn down to the GND level).

The first input signal S2 is also inputted in common to all the precharge circuits 30-1 to 30-n. The second input signal S3 is also inputted commonly to all the pull-down circuits 50-1 to 50-n. The corresponding select signals S1-1 to S1-n are inputted in common to the selector circuits 10-1 to 10-n, precharge circuits 30-1 to 30-n and pull-down circuits 50-1 to 50-n connected to the same bit lines BL1 to BLn.

The precharge circuits 30-1 to 30-n include pMOSs 42-1 to 42-n, AND circuits 44-1 to 44-n, and inverting circuits 46-1 to 46-n, respectively. Here, it is assumed that the first active level of the first input signal S2 is a high level (H), for example, the same level as that of VDD, and the first inactive level thereof is a low level (L), for example, the GND level.

The select signals S1-1 to S1-n are inputted respectively to the AND circuits 44-1 to 44-n, and the first input signal S2 is inputted in common to the AND circuits 44-1 to 44-n. Output signals from the AND circuits 44-1 to 44-n are inputted to the gates of the pMOSs 42-1 to 42-n through the inverting circuits 46-1 to 46-n, respectively. The sources of the pMOSs 42-1 to 42-n are connected in common to a second voltage line which is at the VDD level and the drains thereof are connected respectively to the bit lines BL1 to BLn.

When each of the select signals S1-1 to S1-n assumes the select level and the first input signal S2 assumes the first active level, namely, when each of the select signals S1-1 to S1-n and the first input signal S2 are both high in level, each of the AND circuits 44-1 to 44-n outputs a high-level signal. The high-level signals outputted from the AND circuits 44-1 to 44-n are inverted into low-level signals by the inverting circuits 46-1 to 46-n and then applied to the gates of the pMOSs 42-1 to 42-n to turn on the pMOSs 42-1 to 42-n, respectively. As the pMOSs 42-1 to 42-n are turned on, charges are supplied from the second voltage line to the bit lines BL1 to BLn. As a result, when the bit lines BL1 to BLn are in the floating state, the voltage levels thereof become the predetermined voltage level, namely, the VDD level which is the same as that of the second voltage line.

On the other hand, when each of the select signals S1-1 to S1-n assumes the non-select level or the first input signal S2 assumes the first inactive level, namely, when any one or both of each of the select signals S1-1 to S1-n and the first input signal S2 are low in level, each of the AND circuits 44-1 to 44-n outputs a low-level signal, thereby causing the pMOSs 42-1 to 42-n to be turned off.

In the following description, it is assumed that the precharge circuits 30-1 to 30-n are turned on when the pMOSs 42-1 to 42-n thereof are turned on, and off when the pMOSs 42-1 to 42-n are turned off.

The pull-down circuits 50-1 to 50-n include nMOSs 62-1 to 62-n, and AND circuits 64-1 to 64-n, respectively. Here, it is assumed that the second active level of the second input signal S3 is a high level (H), for example, the same level as that of VDD, and the second inactive level thereof is a low level (L), for example, the GND level.

The select signals S1-1 to S1-n are inputted respectively to the AND circuits 64-1 to 64-n, and the second input signal S3 is inputted in common to the AND circuits 64-1 to 64-n. Output signals from the AND circuits 64-1 to 64-n are inputted to the gates of the nMOSs 62-1 to 62-n, respectively. The sources of the nMOSs 62-1 to 62-n are grounded and the drains thereof are connected respectively to the bit lines BL1 to BLn.

When each of the select signals S1-1 to S1-n assumes the select level and the second input signal S3 assumes the second active level, namely, when each of the select signals S1-1 to S1-n and the second input signal S3 are both high in level, each of the AND circuits 64-1 to 64-n outputs a high-level signal. The high-level signals outputted from the AND circuits 64-1 to 64-n are applied to the gates of the nMOSs 62-1 to 62-n to turn on the nMOSs 62-1 to 62-n, respectively. As the nMOSs 62-1 to 62-n are turned on, the bit lines BL1 to BLn are grounded, so that the voltage levels thereof become the GND level.

On the other hand, when each of the select signals S1-1 to s1-n assumes the non-select level or the second input signal S3 assumes the second inactive level, namely, when any one or both of each of the select signals S1-1 to S1-n and the second input signal S3 are low in level, each of the AND circuits 64-1 to 64-n outputs a low-level signal, thereby causing the nMOSs 62-1 to 62-n to be turned off.

In the following description, it is assumed that the pull-down circuits 50-1 to 50-n are turned on when the nMOSs 62-1 to 62-n thereof are turned on, and off when the nMOSs 62-1 to 62-n are turned off.

Operation of First Embodiment

Figure 4A:
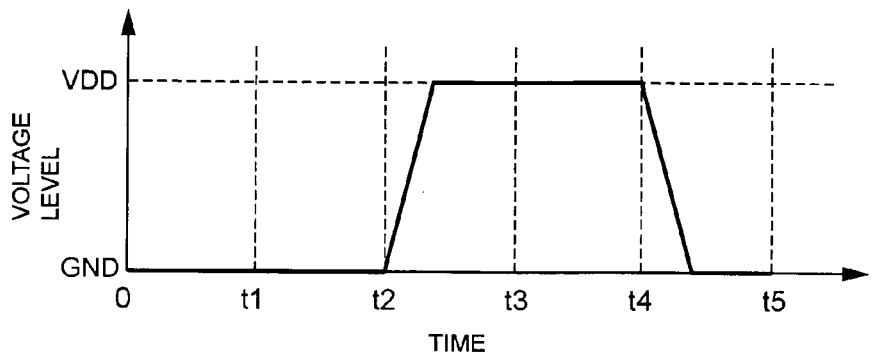
FIGS. 4A to 4C are views illustrating the operation of the semiconductor memory device according to the first embodiment.
Figure 4B:
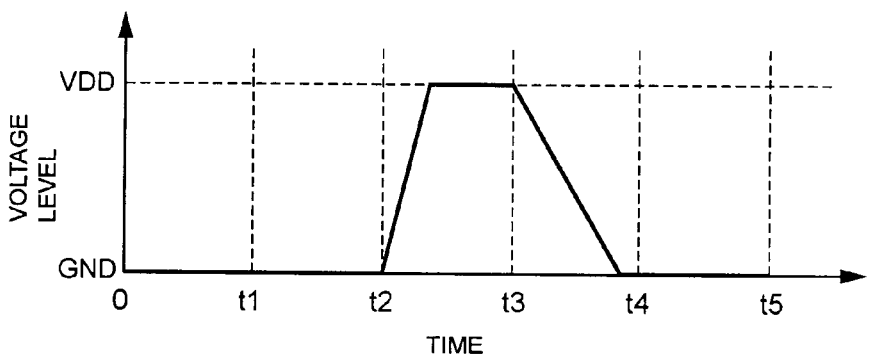
Figure 4C:
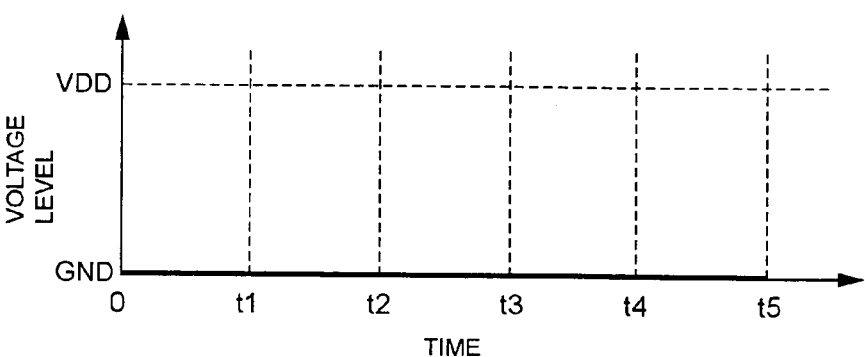

The operation of the semiconductor memory device according to the first embodiment will hereinafter be described with reference to FIG. 3 and FIGS. 4A, 4B and 4C. FIGS. 4A, 4B and 4C are views illustrating the operation of the mask ROM, which is the semiconductor memory device according to the first embodiment. In FIGS. 4A, 4B and 4C, the abscissa axis represents time and the ordinate axis represents bit line voltage level.

FIG. 4A illustrates an example of the operation of the mask ROM in the case of reading the memory cell transistor T11. In this operation example, it is assumed that the source of the memory cell transistor T11 is in the floating state, namely, the memory cell transistor T11 is set to the high-level read mode.

In the initial state of every read cycle, all the bit lines BL1 to BLn are set to the GND level. In order to set all the bit lines BL1 to BLn to the GND level, for example, the second input signal S3 must be set to the second active level and all the select signals S1-1 to S1-$n$ must be set to the select level. Also, all the word lines WL1 to WLm must be set to the GND level.

At a time t1, the select signal S1-1 is set to the select level and the other select signals S1-2 to S1-$n$ are set to the non-select level. As a result, the bit line BL1 and the data line DL are electrically connected with each other.

At a time t2, the first input signal S2 is set to the first active level. As a result, the precharge circuit 30-1 connected to the bit line BL1 is turned on, thereby causing the voltage level of the bit line BL1 to become the VDD level. In contrast, the precharge circuits 30-2 to 30-$n$ connected to the bit lines BL2 to BLn other than the bit line BL1 remain off because the select signals S1-2 to S1-$n$ are at the non-select level.

At a time t3 after the voltage level of the bit line BL1 becomes the VDD level, the first input signal S2 is changed from the first active level to the first inactive level. As a result, the precharge circuit 30-1 is turned off. Similarly, at the time t3, the word line WL1 is set to the VDD level, so as to turn on the memory cell transistor T11. At this time, the memory cell transistors T12 to T1$n$ whose gates are connected to the same word line WL1 are turned on, too. On the other hand, the memory cell transistors T21 to Tmn, the gates of which are connected to the word lines WL2 to WLm other than the word line WL1, remain off.

Because the source of the memory cell transistor T11 is in the floating state, the bit line BL1 connected to the drain of the memory cell transistor T11 is in the floating state, too, although the memory cell transistor T11 is turned on. As a result, the bit line BL1 is held at the VDD level. Consequently, the voltage of the bit line BL1 is in the high-level read mode and is read via the data line DL electrically connected with the bit line BL1.

At a time t4 after the lapse of a read period of the bit line BL1, the second input signal S3 is set to the second active level. As a result, the pull-down circuit 50-1 connected to the bit line BL1 is turned on because the select signal S1-1 is at the select level, thereby causing the voltage of the bit line BL1 to fall to the GND level. In contrast, the pull-down circuits 50-2 to 50-$n$ connected to the bit lines BL2 to BLn other than the bit line BL1 remain off because the select signals S1-2 to S1-$n$ are at the non-select level.

At a time t5 after the voltage level of the bit line BL1 becomes the GND level, the select signal S1-1 is changed from the select level to the non-select level and the operation of the mask ROM thus enters the initial state of the next read cycle. The voltage level of the word line WL1 also becomes the GND level, thereby causing the memory cell transistors T11 to T1$n$ whose gates are connected to the word line WL1 to be turned off. The second input signal S3 may be changed from the second active level to the second inactive level at any time until the time t2 at which the associated precharge circuit is turned on, namely, the first input signal S2 is set to the first active level, in the next read cycle. In the present embodiment, the second input signal S3 is changed from the second active level to the second inactive level at the time t2.

FIG. 4B illustrates an example of the operation of the mask ROM in the case of reading the memory cell transistor T21. In this operation example, it is assumed that the source of the memory cell transistor T21 is in the grounded state, namely, the memory cell transistor T21 is set to the low-level read mode. It is assumed that, in the initial state of every read cycle, all the bit lines BL1 to BLn are at the GND level and all the word lines WL1 to WLm are at the GND level, too.

At the time t1, it is assumed that the select signal S1-1 is at the select level and the other select signals S1-2 to S1-$n$ are at the non-select level. As a result, the bit line BL1 and the data line DL are electrically connected with each other.

At the time t2, the first input signal S2 is set to the first active level. As a result, the precharge circuit 30-1 connected to the bit line BL1 is turned on, thereby causing the voltage level of the bit line BL1 to become the VDD level. On the other hand, the precharge circuits 30-2 to 30-$n$ connected to the bit lines BL2 to BLn other than the bit line BL1 remain off because the select signals S1-2 to S1-$n$ are at the non-select level.

At the time t3 after the voltage level of the bit line BL1 becomes the VDD level, the first input signal S2 is changed from the first active level to the first inactive level, thus turning off the precharge circuit 30-1. Similarly, at the time t3, the word line WL2 is set to the VDD level, so as to turn on the memory cell transistor T21. At this time, the memory cell transistors T22 to T2$n$ whose gates are connected to the same word line WL2 are turned on, too. On the other hand, the pull-down circuits 50-2 to 50-$n$ connected to the bit lines BL2 to BLn other than the bit line BL1 remain off because the select signals S1-2 to S1-$n$ are at the non-select level.

Because the source of the memory cell transistor T21 is in the grounded state, the voltage of the bit line BL1 falls from the VDD level if the memory cell transistor T21 is turned on. Consequently, the voltage of the bit line BL1 is in the low-level read mode and is read via the data line DL electrically connected with the bit line BL1.

At the time t4 after the lapse of a read period of the bit line BL1, the second input signal S3 is set to the second active level. As a result, the pull-down circuit 50-1 connected to the bit line BL1 is turned on, thereby causing the voltage level of the bit line BL1 to become the GND level. In contrast, the pull-down circuits 50-2 to 50-$n$ connected to the bit lines BL2 to BLn other than the bit line BL1 remain off because the select signals S1-2 to S1-$n$ are at the non-select level.

At the time t5 after the voltage level of the bit line BL1 becomes the GND level, the select signal S1-1 is changed from the select level to the non-select level and the operation of the mask ROM thus enters the initial state of the next read cycle. The voltage level of the word line WL2 also becomes the GND level, thereby causing the memory cell transistors T21 to T2$n$ whose gates are connected to the word line WL2 to be turned off.

FIG. 4C illustrates the voltage levels of the non-select bit lines when the memory cell transistor T11 is read in the above-described read cycle. Here, a description will be given of the bit line BL2 as an example.

In the initial state, the bit line BL2 is at the GND level.

At the time t1, when the bit line BL1 is selected, the select signal S1-2 is at the non-select level because the bit line BL2 is not selected.

At the time t2, although the first input signal S2 is set to the first active level, the precharge circuit 30-2 remains off because the select signal S1-2 is at the non-select level. As a result, the bit line BL2 is held at the GND level.

At the time t3, because the bit line BL2 is at the GND level, it remains at the GND level, not changed, although the word line WL1 is set to the VDD level so as to turn on the memory cell transistor T12 set to the low-level read mode. Provided that the memory cell transistor T12 is set to the high-level read mode, the bit line BL2 will similarly remain at the GND level, not changed.

At the time t4, although the second input signal S3 is set to the second active level, the pull-down circuit 50-2 remains off because the select signal S1-2 is at the non-select level. However, the bit line BL2 is already at the GND level at the time that the second input signal S3 is set to the second active level. Consequently, the bit line BL2 is held at the GND level.

As stated above, the semiconductor memory device according to the first embodiment comprises the pull-down circuits to set a selected bit line to the VDD level, read the voltage of the bit line from the data line, and then set the bit line to the GND level by means of the associated pull-down circuit. For this reason, bit lines, not selected, can be held at the GND level. Since the non-select bit lines remain at the GND level, not changed, the select bit line is not subject to a voltage reduction resulting from the action of coupling capacitance between the select bit line and the non-select bit lines. That is, it is possible to prevent misreading of a stored value of a memory cell transistor connected to the select bit line.

In addition, because the non-select bit lines are held at the GND level, it is possible to reduce current consumption in the non-select bit lines.

Figure 5:
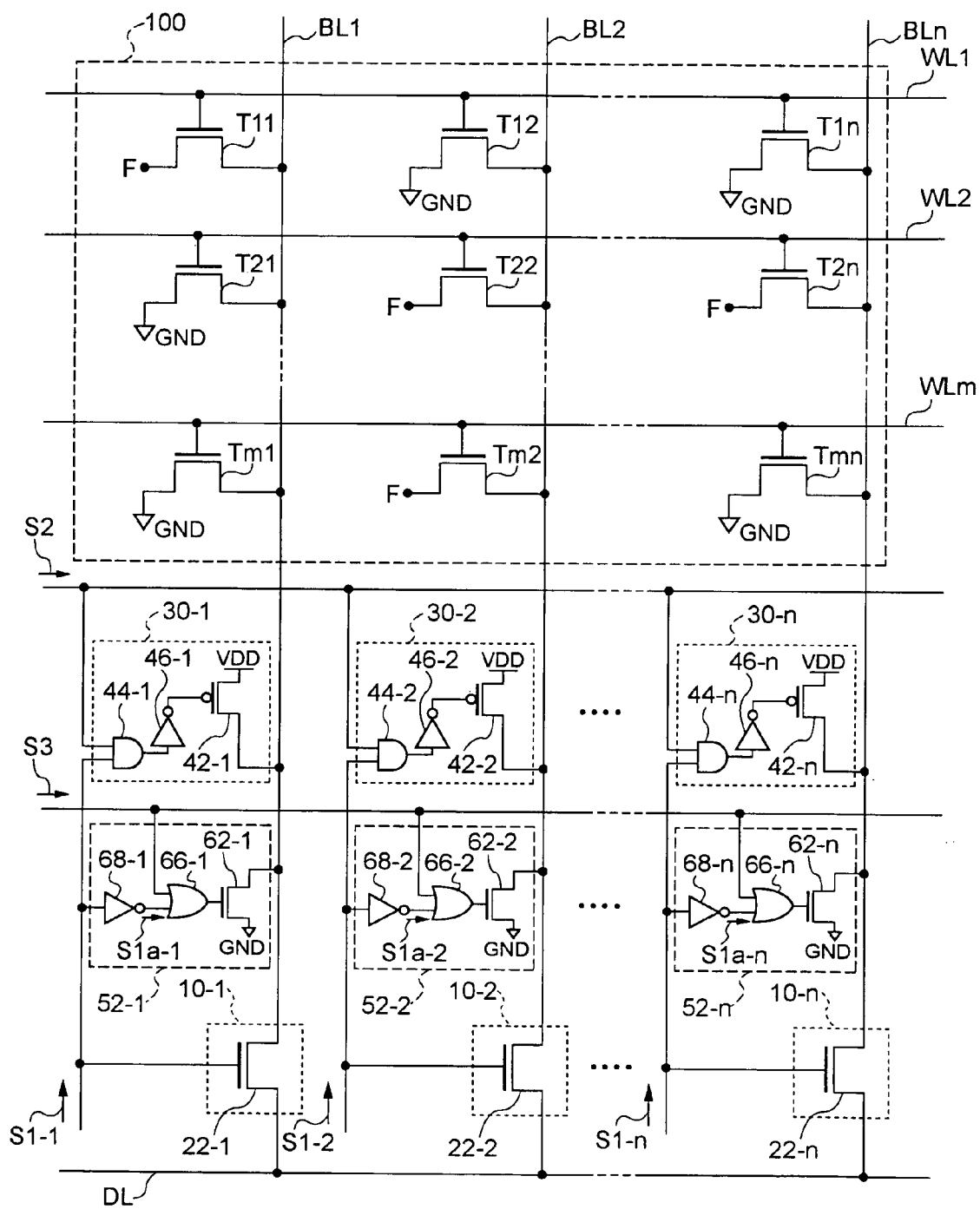
FIG. 5 is a circuit diagram schematically showing the configuration of a mask ROM, which is a semiconductor memory device according to a second embodiment of the present invention.

Configuration of Second Embodiment and Basic Operations of Respective Parts Thereof FIG. 5 is a circuit diagram schematically showing the configuration of a mask ROM, which is a semiconductor memory device according to a second embodiment of the present invention. The circuit configuration of the second embodiment is the same as that of the first embodiment described above with reference to FIG. 3, with the exception of the configuration of pull-down circuits 52-1 to 52-n, and a duplicate description thereof will thus be omitted.

The pull-down circuits 52-1 to 52-n include nMOSs 62-1 to 62-n, OR circuits 66-1 to 66-n, and inverting circuits 68-1 to 68-n, respectively.

The select signals S1-1 to s1-n are inverted by the inverting circuits 68-1 to 68-n, respectively, and the resulting inverted select signals S1a-1 to S1a-n are inputted to the OR circuits 66-1 to 66-n, respectively. The second input signal S3 is also inputted in common to the OR circuits 66-1 to 66-n. Output signals from the OR circuits 66-1 to 66-n are inputted to the gates of the nMOSs 62-1 to 62-n, respectively. The sources of the nMOSs 62-1 to 62-n are connected in common to the first voltage line, which is at the GND level, and the drains thereof are connected respectively to the bit lines BL1 to BLn.

When each of the select signals S1-1 to S1-n assumes the non-select level or the second input signal S3 assumes the second active level, namely, when any one or both of each of the inverted select signals S1a-1 to S1a-n and the second input signal S3 are high in level, each of the OR circuits 66-1 to 66-n outputs a high-level signal. The high-level signals outputted from the OR circuits 66-1 to 66-n are applied to the gates of the nMOSs 62-1 to 62-n to turn on the nMOSs 62-1 to 62-n, respectively. As the nMOSs 62-1 to 62-n are turned on, the voltage levels of the bit lines BL1 to BLn become the GND level.

On the other hand, when each of the select signals S1-1 to S1-n assumes the select level and the second input signal S3 assumes the second inactive level, namely, when each of the inverted select signals S1a-1 to S1a-n and the second input signal S3 are both low in level, each of the OR circuits 66-1 to 66-n outputs a low-level signal, thereby causing the nMOSs 62-1 to 62-n to be turned off.

In the following description, it is assumed that the pull-down circuits 52-1 to 52-n are turned on when the nMOSs 62-1 to 62-n thereof are turned on, and off when the nMOSs 62-1 to 62-n are turned off.

Operation of Second Embodiment

Figure 6A:
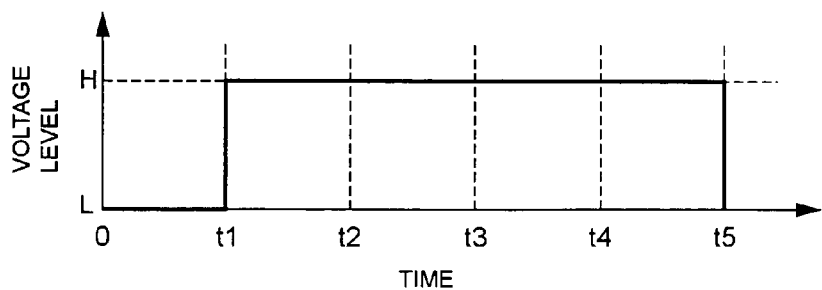
FIGS. 6A to 6D are views illustrating the operation of the semiconductor memory device according to the second embodiment.
Figure 6B:
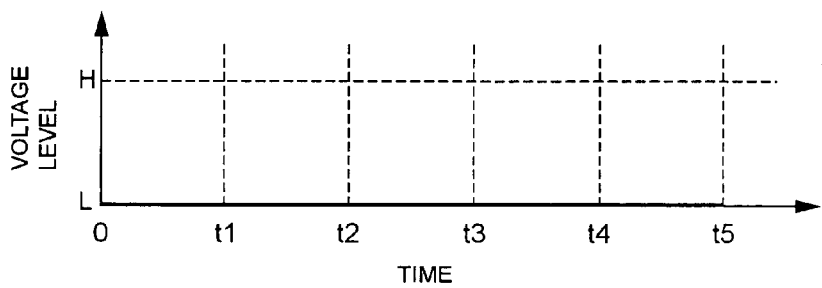
Figure 6C:
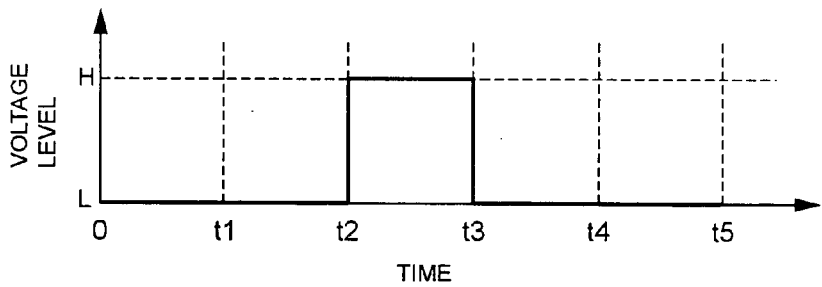
Figure 6D:
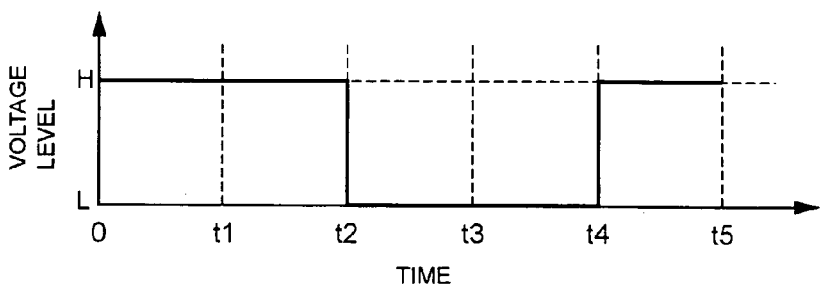

The operation of the semiconductor memory device according to the second embodiment will hereinafter be described with reference to FIGS. 6A, 6B, 6C and 6D. FIGS. 6A, 6B, 6C and 6D are views illustrating the operation of the mask ROM, which is the semiconductor memory device according to the second embodiment. In FIGS. 6A, 6B, 6C and 6D, the abscissa axis represents time and the ordinate axis represents control signal voltage level. Here, a description will be given of the operation of the mask ROM in the case of reading the memory cell transistor T11. FIG. 6A shows the voltage level of the select signal S1-1 for the select bit line BL1. FIG. 6B shows the voltage levels of the select signals S1-2 to s1-n for the non-select bit lines BL2 to BLn. FIG. 6C shows the voltage level of the first input signal S2. FIG. 6D shows the voltage level of the second input signal S3.

The voltage level of the select signal S1-1 for the select bit line BL1 becomes the select level at the time t1 and the non-select level at the time t5 (see FIG. 6A). The select signals S1-2 to S1-n for the non-select bit lines BL2 to BLn are always at the non-select level (see FIG. 6B).

The voltage level of the first input signal S2 becomes the first active level at the time t2 and the first inactive level at the time t3. As a result, the precharge circuit 30-1 connected to the select bit line BL1 is operated for a period from the time t2 to time t3 (see FIG. 6C).

The voltage level of the second input signal S3 becomes the second active level at the time t4, and the second inactive level in a period from the time t5 to the time t2 of the next read cycle. In the present embodiment, the voltage level of the second input signal S3 is described to become the second inactive level at the time t2 (see FIG. 6D).

In this embodiment, the pull-down circuits 52-1 to 52-n are turned on when the select signals S1-1 to S1-n assume the non-select level or the second input signal S3 assumes the second active level. Hence, because the select signals S1-2 to S1-n are at the non-select level, the pull-down circuits 52-2 to 52-n connected to the non-select bit lines BL2 to BLn are always on, so the non-select bit lines BL2 to BLn are held at the GND level. Also, because the second input signal S3 is at the second active level at the time t4, the pull-down circuit 52-1 connected to the select bit line BL1 remains on for the period from the time t4 to time t5.

Consequently, the voltages of the respective bit lines BL1 to BLn are subject to the same variations as those in the first embodiment described above with reference to FIGS. 4A to 4C.

According to the configuration of the second embodiment, since non-select bit lines are always in the grounded state, the voltages thereof are not easy to vary, resulting in a reduction in the possibility thereof to have an effect on reading of a select bit line.

Figure 7:
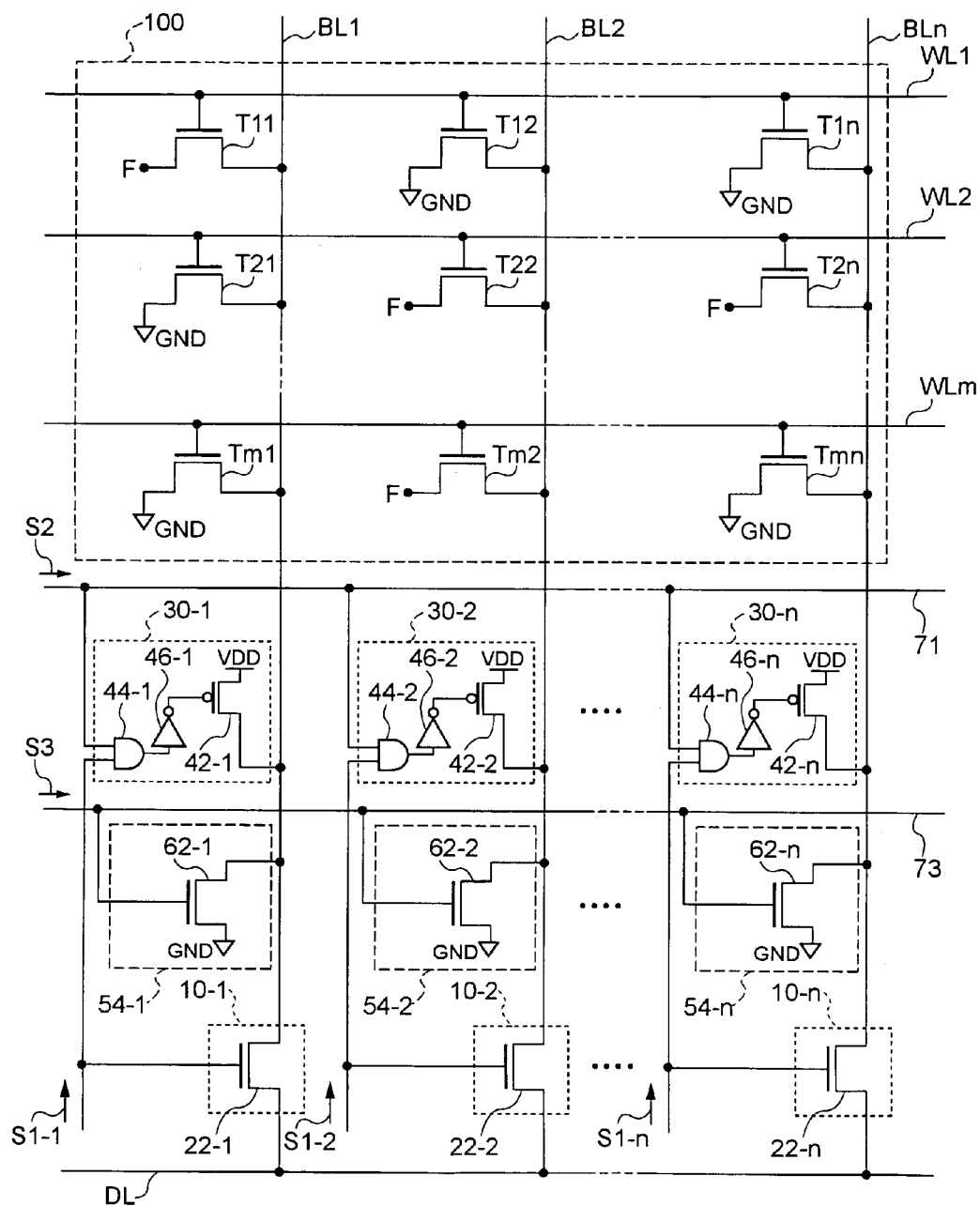
FIG. 7 is a circuit diagram schematically showing the configuration of a mask ROM, which is a semiconductor memory device according to a third embodiment of the present invention.

Configuration of Third Embodiment and Basic Operations of Respective Parts Thereof FIG. 7 is a circuit diagram schematically showing the configuration of a mask ROM, which is a semiconductor memory device according to a third embodiment of the present invention. The circuit configuration of the third embodiment is the same as that of the first embodiment described above with reference to FIG. 3, with the exception of the configuration of pull-down circuits 54-1 to 54-$n$, and a duplicate description thereof will thus be omitted.

The pull-down circuits 54-1 to 54-$n$ include nMOSs 62-1 to 62-$n$, respectively. The second input signal S3 is inputted in common to the gates of the nMOSs 62-1 to 62-$n$ of the pull-down circuits 54-1 to 54-$n$. The sources of the nMOSs 62-1 to 62-$n$ are grounded and the drains thereof are connected respectively to the bit lines BL1 to BLn.

When the second input signal S3 assumes the second active level, or high level, the nMOSs 62-1 to 62-$n$ are turned on. As the nMOSs 62-1 to 62-$n$ are turned on, the voltage levels of the bit lines BL1 to BLn become the GND level.

On the other hand, when the second input signal S3 assumes the second inactive level, or low level, the nMOSs 62-1 to 62-$n$ are turned off.

Operation of Third Embodiment

The precharge operation is performed in the same manner as that of the first embodiment. In the pull-down operation, the pull-down circuits 54-1 to 54-$n$ connected to any of non-select bit lines and a select bit line are operated in the same manner, because the select signals S1-1 to S1-$n$ are not inputted thereto. That is, the pull-down circuits 54-1 to 54-$n$ remain off for a period from the time t2 to time t4, and on for a period from the time t4 to the time t2 of the next read cycle.

Consequently, the voltages of respective select bit lines are subject to the same variations as those in the first embodiment described above with reference to FIGS. 4A to 4C. Moreover, because non-select bit lines are at the GND level in both the on and off states of the pull-down circuits, the voltages thereof are subject to the same variations as those in the first embodiment described above with reference to FIGS. 4A to 4C.

According to the configuration of the third embodiment, each pull-down circuit can be implemented by one nMOS, resulting in a reduction in area of the semiconductor memory device.

Figure 8:
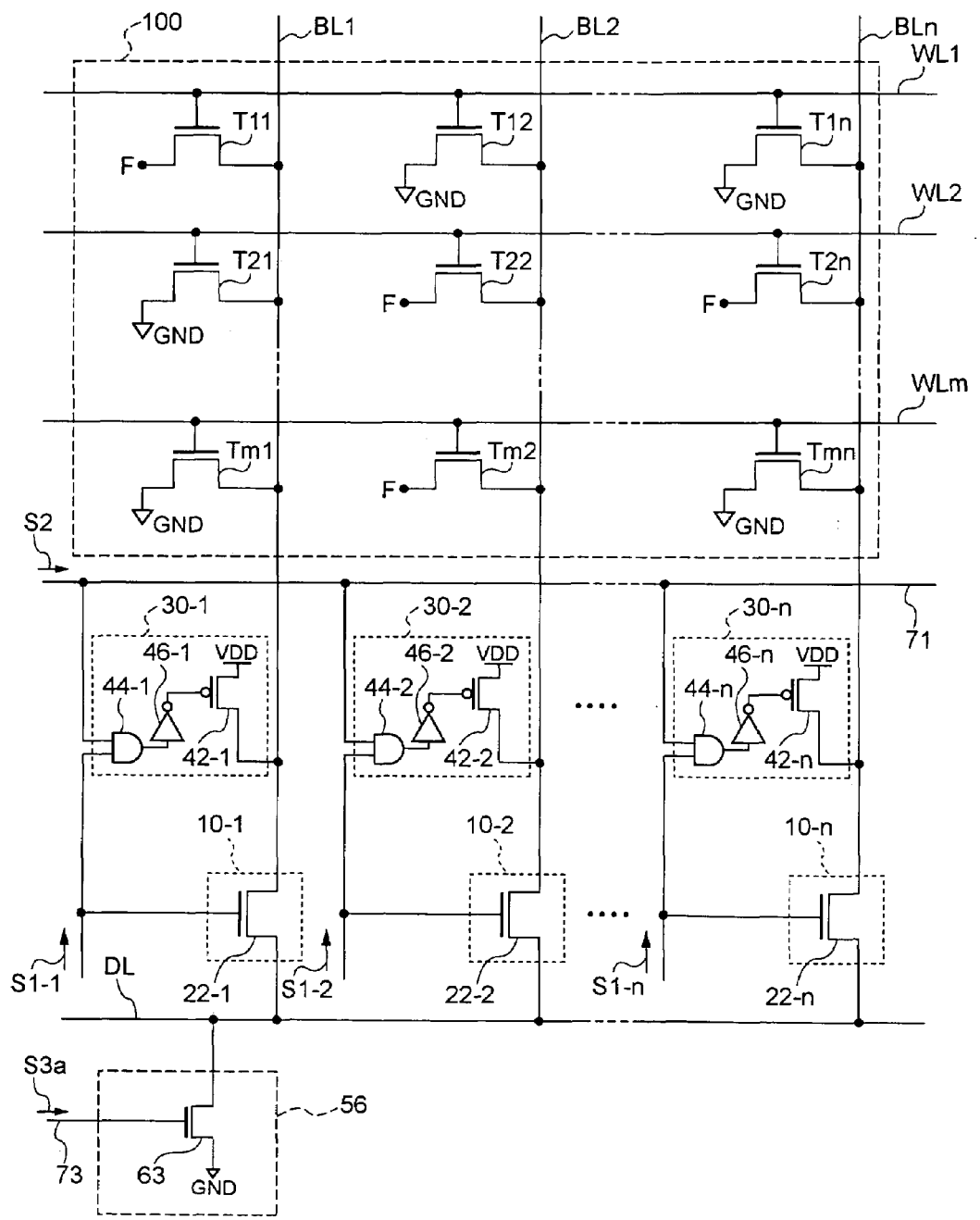
FIG. 8 is a circuit diagram schematically showing the configuration of a mask ROM, which is a semiconductor memory device according to a fourth embodiment of the present invention.

Configuration of Fourth Embodiment and Basic Operations of Respective Parts Thereof FIG. 8 is a circuit diagram schematically showing the configuration of a mask ROM, which is a semiconductor memory device according to a fourth embodiment of the present invention. The circuit configuration of the fourth embodiment is the same as that of the first embodiment described above with reference to FIG. 3, with the exception that a pull-down circuit 56 is connected, not to each of the bit lines BL1 to BLn, but directly to the data line DL, and a duplicate description thereof will thus be omitted.

The pull-down circuit 56 includes an nMOS 63.

A second input signal S3$a$ is inputted to the gate of the nMOS 63 of the pull-down circuit 56. The source of the nMOS 63 is grounded and the drain thereof is connected to the data line DL.

When the second input signal S3$a$ assumes the second active level, or high level, the nMOS 63 is turned on. As the nMOS 63 is turned on, the data line DL is grounded and the voltage levels of the bit lines BL1 to BLn electrically connected with the data line DL become the GND level, too. On the other hand, when the second input signal S3$a$ assumes the second inactive level, or low level, the nMOS 63 is turned off.

Operation of Fourth Embodiment

The precharge operation is performed in the same manner as that of the first embodiment. In the pull-down operation, the pull-down circuit 56 is operated in response to the second input signal S3$a$, because no select signal is inputted thereto. That is, the pull-down circuit 56 remains off for the period from the time t2 to time t4, and on for the period from the time t4 to the time t2 of the next read cycle.

The voltage levels of the bit lines BL1 to BLn, connected with the data line DL owing to the turning-on of the selector circuits 10-1 to 10-$n$, become the GND level when the pull-down circuit 56 is turned on. That is, in the case where any one of the bit lines BL1 to BLn is selected, for the period from the time t4 to time t5, the data line DL is grounded, so that the selected bit line and the data line DL are electrically connected with each other.

Consequently, the voltages of the respective bit lines BL1 to BLn are subject to the same variations as those in the first embodiment described above with reference to FIGS. 4A to 4C.

The configuration of the fourth embodiment provides a greater area reduction effect than that of the third embodiment in that only one pull-down circuit is connected to the data line DL.

Figure 9:
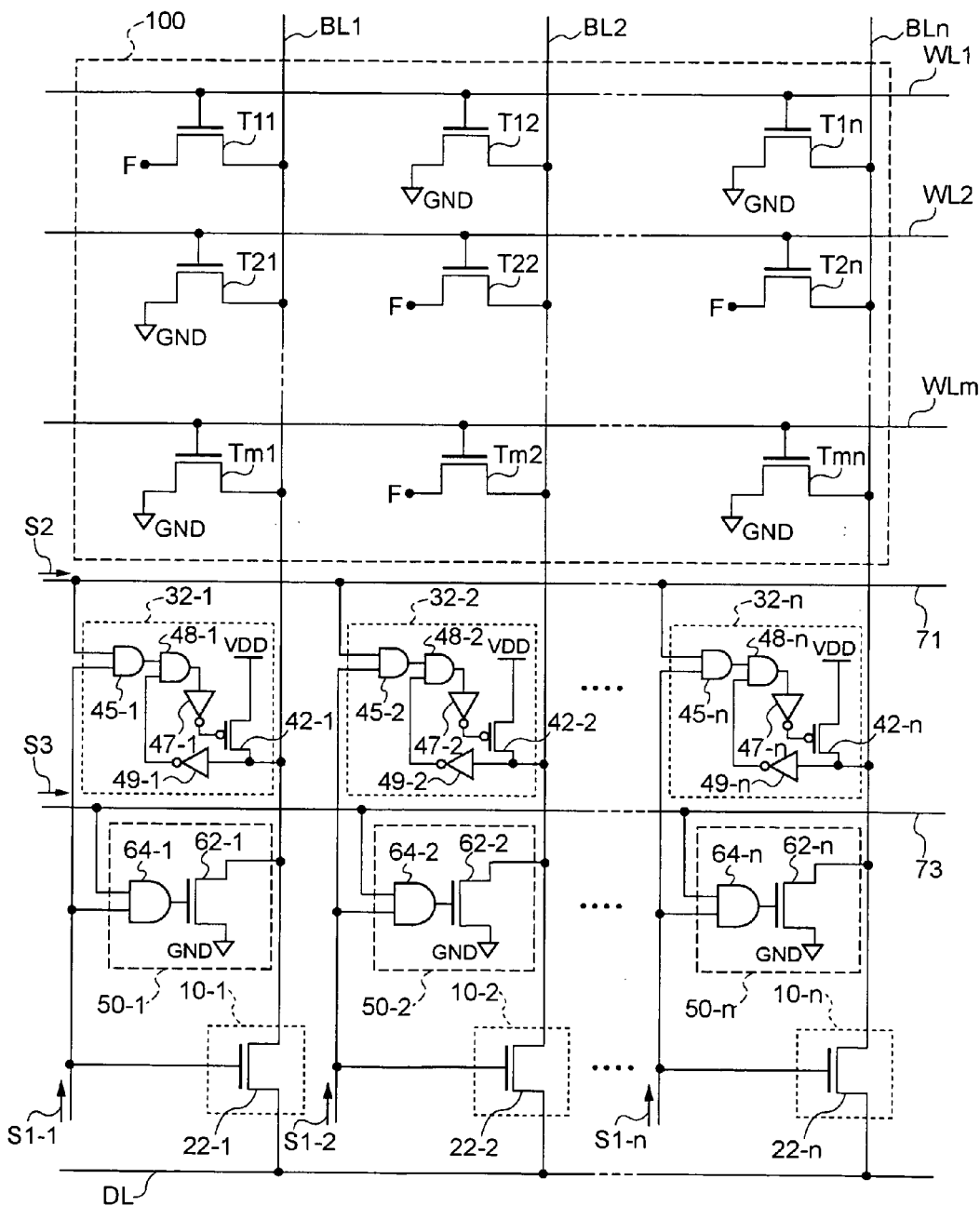
FIG. 9 is a circuit diagram schematically showing the configuration of a mask ROM, which is a semiconductor memory device according to a fifth embodiment of the present invention.

Configuration of Fifth Embodiment and Basic Operations of Respective Parts Thereof FIG. 9 is a circuit diagram schematically showing the configuration of a mask ROM, which is a semiconductor memory device according to a fifth embodiment of the present invention. The circuit configuration of the fifth embodiment is the same as that of the first embodiment described above with reference to FIG. 3, with the exception of the configuration of precharge circuits 32-1 to 32-$n$, and a duplicate description thereof will thus be omitted.

The precharge circuits 32-1 to 32-$n$ include pMOSs 42-1 to 42-$n$, first AND circuits 45-1 to 45-$n$, second AND circuits 48-1 to 48-$n$, first inverting circuits 47-1 to 47-$n$, and second inverting circuits 49-1 to 49-$n$, respectively.

The select signals S1-1 to S1-$n$ are inputted respectively to the first AND circuits 45-1 to 45-$n$, and the first input signal S2 is inputted in common to the first AND circuits 45-1 to 45-$n$. Output signals from the first AND circuits 45-1 to 45-$n$ are inputted to the second AND circuits 48-1 to 48-$n$, respectively. The voltages of the bit lines BL1 to BLn are also inputted to the second AND circuits 48-1 to 48-n via the second inverting circuits 49-1 to 49-n, respectively. Output signals from the second AND circuits 48-1 to 48-n are inputted to the gates of the pMOSs 42-1 to 42-n through the first inverting circuits 47-1 to 47-n, respectively. The sources of the pMOSs 42-1 to 42-n are connected in common to the second voltage line which is at the VDD level and the drains thereof are connected respectively to the bit lines BL1 to BLn. If the threshold voltages of the second inverting circuits 49-1 to 49-n are set to VDD/2, the second inverting circuits 49-1 to 49-n output high-level signals when the voltages of the bit lines BL1 to BLn are lower than VDD/2, and low-level signals when the voltages of the bit lines BL1 to BLn are higher than or equal to VDD/2.

A description will hereinafter be given on the assumption that the bit lines BL1 to BLn are at the GND level.

When each of the select signals S1-1 to S1-n assumes the select level and the first input signal S2 assumes the first active level, namely, when each of the select signals S1-1 to S1-n and the first input signal S2 are both high in level, each of the first AND circuits 45-1 to 45-n outputs a high-level signal. The high-level signals outputted from the first AND circuits 45-1 to 45-n are inputted to the second AND circuits 48-1 to 48-n, respectively.

At this time, because the bit lines BL1 to BLn are at the GND level which is lower than VDD/2, the second inverting circuits 49-1 to 49-n output high-level signals, which are then inputted to the second AND circuits 48-1 to 48-n, respectively. Each of the second AND circuits 48-1 to 48-n outputs a high-level signal, too, because both of the two signals inputted thereto are high in level. These high-level signals from the second AND circuits 48-1 to 48-n are inverted into low-level signals by the first inverting circuits 47-1 to 47-n and then applied to the gates of the pMOSs 42-1 to 42-n to turn on the pMOSs 42-1 to 42-n, respectively.

As the pMOSs 42-1 to 42-n are turned on, charges are supplied from the second voltage line to the bit lines BL1 to BLn. When the bit lines BL1 to BLn are in the floating state, the voltages thereof rise due to through-currents of the pMOSs 42-1 to 42-n. If the voltages of the bit lines BL1 to BLn become higher than or equal to the threshold voltages, VDD/2, of the second inverting circuits 49-1 to 49-n as a result of the rising, the outputs of the second inverting circuits 49-1 to 49-n become low in level. The output of each of the second AND circuits 48-1 to 48-n becomes low in level, since one of the inputs to each of the second AND circuits 48-1 to 48-n is low in level. As a result, the pMOSs 42-1 to 42-n are turned off, so as to stop the supply of currents to the bit lines BL1 to BLn. In this manner, in the precharge operation, the voltages of the bit lines BL1 to BLn do not rise to VDD and are stopped at VDD/2.

As described above, in these precharge circuits 32-1 to 32-n, the threshold voltages of the second inverting circuits 49-1 to 49-n are preset to a low voltage level lower than VDD, thereby enabling the bit lines BL1 to BLn to be set to the low voltage level.

Operation of Fifth Embodiment

Figure 10A:
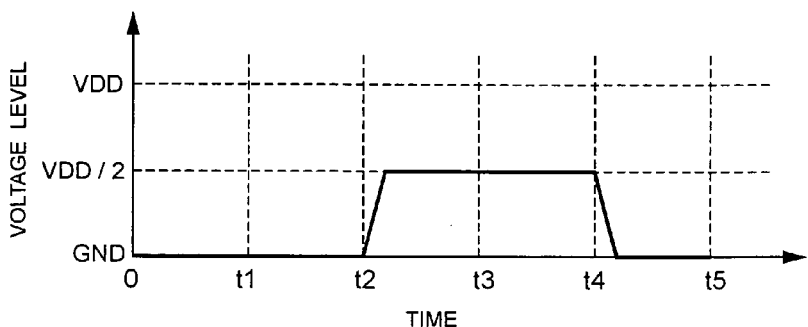
FIGS. 10A to 10C are views illustrating the operation of the semiconductor memory device according to the fifth embodiment.
Figure 10B:
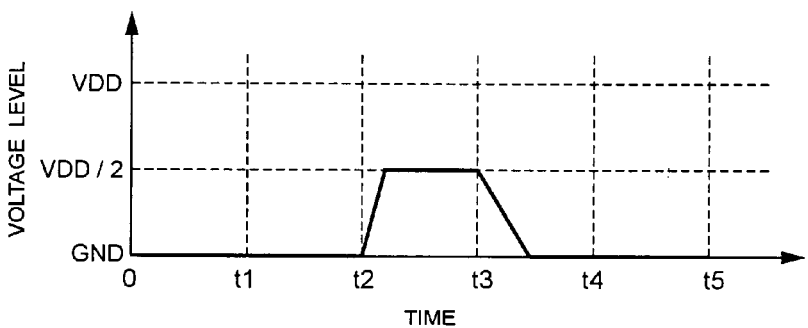
Figure 10C:
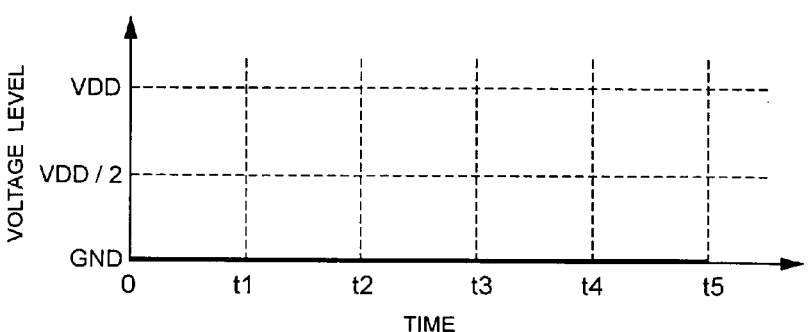

The operation of the semiconductor memory device according to the fifth embodiment will hereinafter be described with reference to FIGS. 10A to 10C. FIGS. 10A to 10C are views illustrating the operation of the mask ROM, which is the semiconductor memory device according to the fifth embodiment. In FIGS. 10A to 10C, the abscissa axis represents time and the ordinate axis represents bit line voltage level.

FIG. 10A shows the voltage level of a select bit line when a stored value of a memory cell transistor set to the high-level read mode is read. FIG. 10B shows the voltage level of a select bit line when a stored value of a memory cell transistor set to the low-level read mode is read. FIG. 10C shows the voltage level of a non-select bit line.

The operation of the fifth embodiment is the same as that of the first embodiment described above with reference to FIGS. 4A to 4C, with the exception that the bit line voltage level does not exceed the low voltage level, VDD/2, and a detailed description thereof will thus be omitted.

The precharge circuits of the fifth embodiment can reduce current consumption by precharging the bit lines to VDD/2 or less.

Further, the precharge circuits of the fifth embodiment are applicable to the second to fourth embodiments, as well as to the first embodiment. By applying the precharge circuits of the fifth embodiment to the second to fourth embodiments, it is possible to not only obtain the inherent effects of the respective embodiments, but also reduce current consumption by precharging the bit lines to VDD/2 or less.

Figure 11:
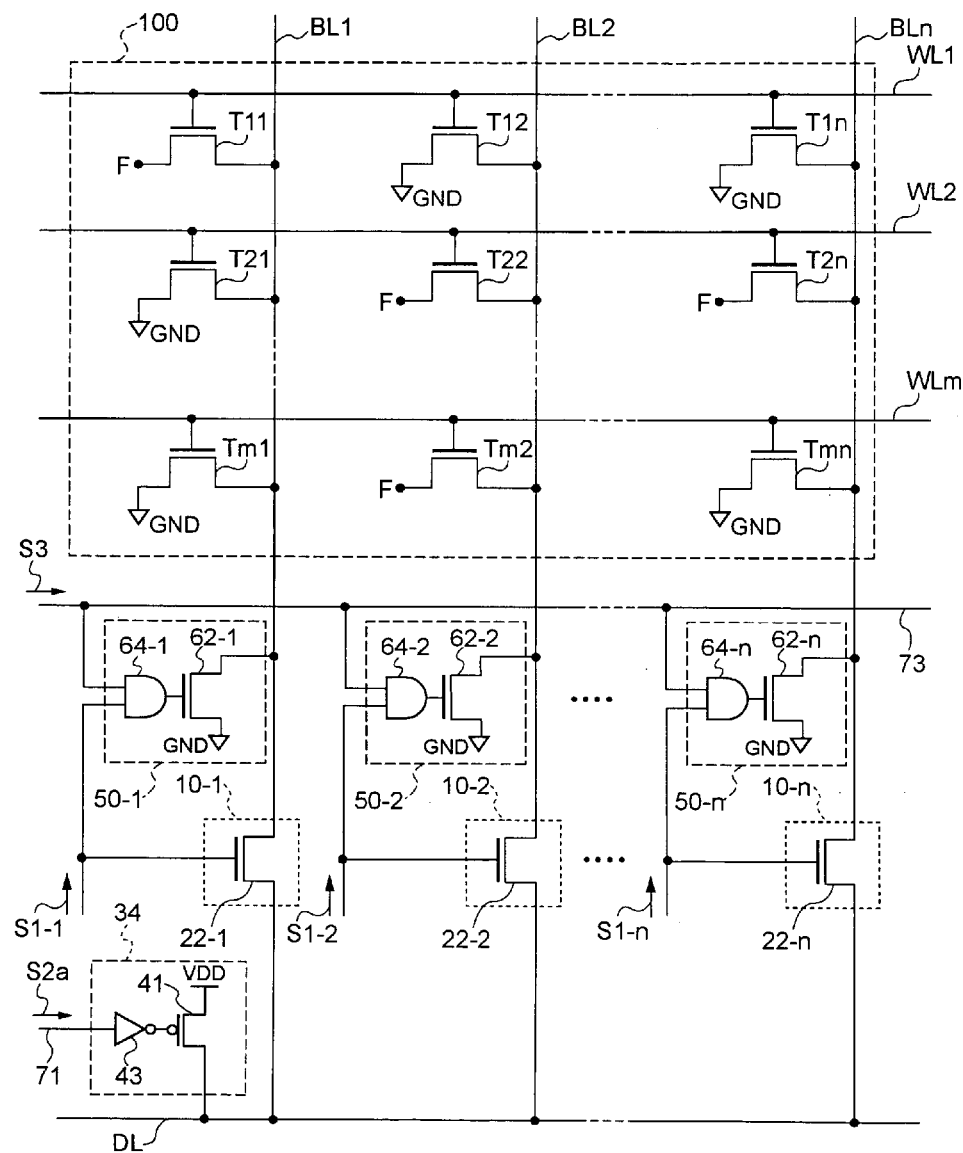
FIG. 11 is a circuit diagram schematically showing the configuration of a mask ROM, which is a semiconductor memory device according to a sixth embodiment of the present invention.

Configuration of Sixth Embodiment and Basic Operations of Respective Parts Thereof FIG. 11 is a circuit diagram schematically showing the configuration of a mask ROM, which is a semiconductor memory device according to a sixth embodiment of the present invention. The circuit configuration of the sixth embodiment is the same as that of the first embodiment described above with reference to FIG. 3, with the exception that a precharge circuit 34 is connected, not to each of the bit lines BL1 to BLn, but directly to the data line DL, and a duplicate description thereof will thus be omitted.

The precharge circuit 34 includes a pMOS 41 and an inverting circuit 43.

A first input signal S2a is inputted to the gate of the pMOS 41 of the precharge circuit 34. The source of the pMOS 41 is connected to the second voltage line and the drain thereof is connected to the data line DL.

When the first input signal S2a assumes the first active level, or high level, the output of the inverting circuit 43 becomes low in level to turn on the pMOS 41. As the pMOS 41 is turned on, the data line DL is electrically connected with the second voltage line, so that the voltage thereof becomes VDD. On the other hand, when the first input signal S2a assumes the first inactive level, or low level, the pMOS 41 is turned off.

Operation of Sixth Embodiment

The pull-down operation is performed in the same manner as that of the first embodiment.

In the precharge operation, because the select signals S1-1 to S1-n are not inputted, the precharge circuit 34 remains on for a period from the time t2 to time t3, and off for a period from the time t3 to the time t2 of the next read cycle.

At the time that the precharge circuit 34 is turned on, the selector circuits 10-1 to 10-n are turned on, thereby causing the voltages of the bit lines BL1 to BLn connected with the data line DL to become VDD.

Consequently, the voltages of the respective bit lines BL1 to BLn are subject to the same variations as those in the first embodiment described above with reference to FIGS. 4A to 4C.

In the sixth embodiment, only one precharge circuit 34 is connected to the data line DL. Therefore, the area of the semiconductor memory device is reduced as compared with that in the first embodiment.

Seventh Embodiment

Figure 12:
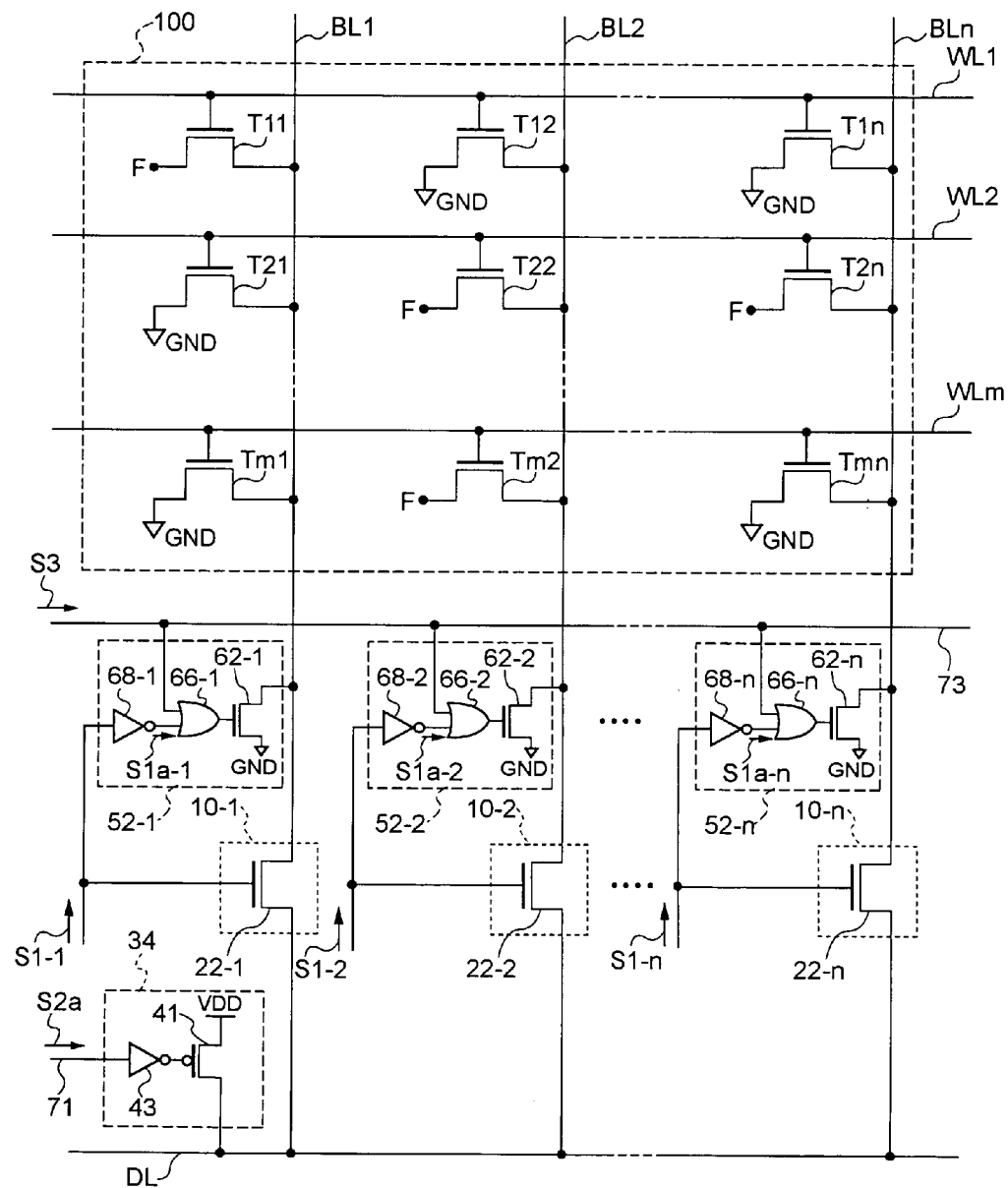
FIG. 12 is a circuit diagram schematically showing the configuration of a mask ROM, which is a semiconductor memory device according to a seventh embodiment of the present invention.

FIG. 12 is a circuit diagram schematically showing the configuration of a mask ROM, which is a semiconductor memory device according to a seventh embodiment of the present invention. The circuit configuration of the seventh embodiment is the same as that of the sixth embodiment described above with reference to FIG. 11, with the exception of the configuration of pull-down circuits 52-1 to 52-n, and a duplicate description thereof will thus be omitted.

The pull-down circuits 52-1 to 52-n include nMOSs 62-1 to 62-n, OR circuits 66-1 to 66-n, and inverting circuits 68-1 to 68-n, respectively. The configuration and basic operation of the pull-down circuits 52-1 to 52-n are the same as those in the second embodiment described above with reference to FIG. 5, and a description thereof will thus be omitted.

According to the configuration of the seventh embodiment, the area of the semiconductor memory device is reduced as compared with that in the first embodiment in that only one precharge circuit 34 is connected to the data line DL. Furthermore, because the non-select bit lines BL2 to BLn are always in the grounded state, the voltages thereof are not easy to vary, resulting in a reduction in the possibility thereof to have an effect on the reading of the select bit line BL1.

Eighth Embodiment

Figure 13:
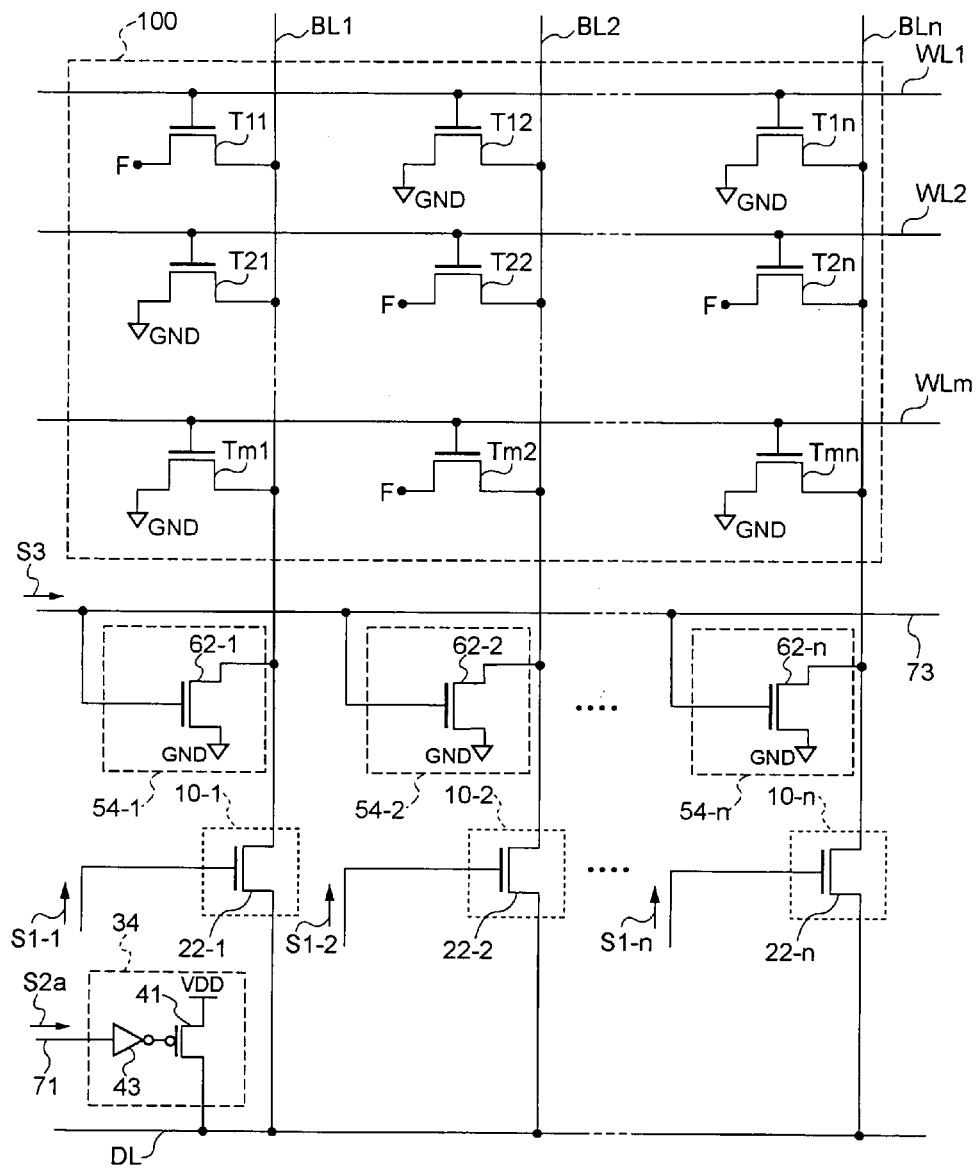
FIG. 13 is a circuit diagram schematically showing the configuration of a mask ROM, which is a semiconductor memory device according to an eighth embodiment of the present invention.

FIG. 13 is a circuit diagram schematically showing the configuration of a mask ROM, which is a semiconductor memory device according to an eighth embodiment of the present invention. The circuit configuration of the eighth embodiment is the same as that of the sixth embodiment described above with reference to FIG. 11, with the exception of the configuration of pull-down circuits 54-1 to 54-n, and a duplicate description thereof will thus be omitted.

The configuration and basic operation of the pull-down circuits 54-1 to 54-n are the same as those in the third embodiment described above with reference to FIG. 7, and a description thereof will thus be omitted.

According to the configuration of the eighth embodiment, only one precharge circuit 34 is connected to the data line DL and each pull-down circuit can be implemented by one nMOS, thereby providing an excellent area reduction effect.

Ninth Embodiment

Figure 14:
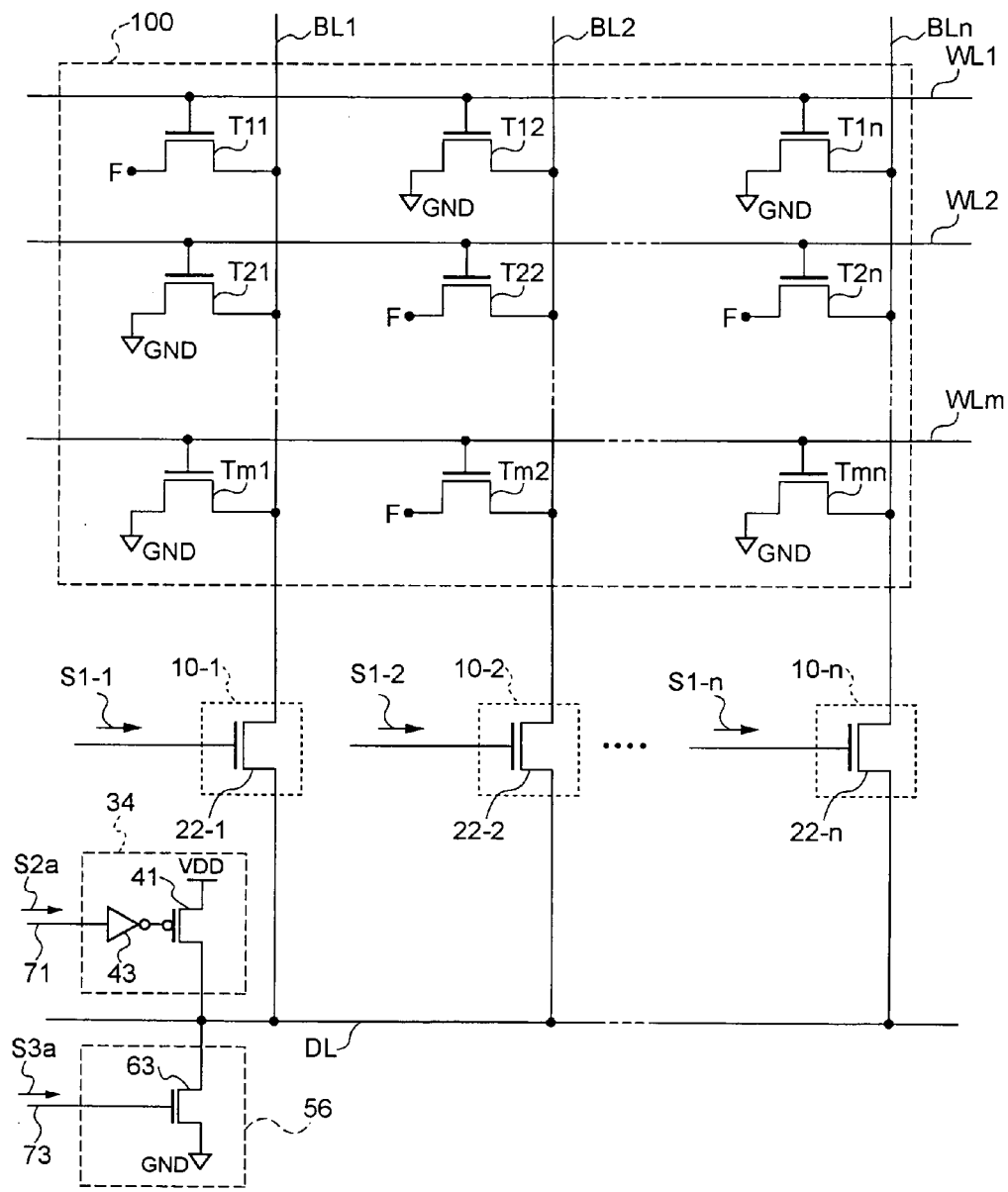
FIG. 14 is a circuit diagram schematically showing the configuration of a mask ROM, which is a semiconductor memory device according to a ninth embodiment of the present invention.

FIG. 14 is a circuit diagram schematically showing the configuration of a mask ROM, which is a semiconductor memory device according to a ninth embodiment of the present invention. The circuit configuration of the ninth embodiment is the same as that of the sixth embodiment described above with reference to FIG. 11, with the exception that a pull-down circuit 56 is connected, not to each of the bit lines BL1 to BLn, but directly to the data line DL, and a duplicate description thereof will thus be omitted.

The configuration of the pull-down circuit 56 is the same as that in the fourth embodiment described above with reference to FIG. 8, and a detailed description thereof will thus be omitted.

The configuration of the ninth embodiment provides a greater area reduction effect than that of the fourth embodiment or eighth embodiment in that only one pull-down circuit and only one precharge circuit are connected to the data line DL.

Tenth Embodiment

Figure 15:
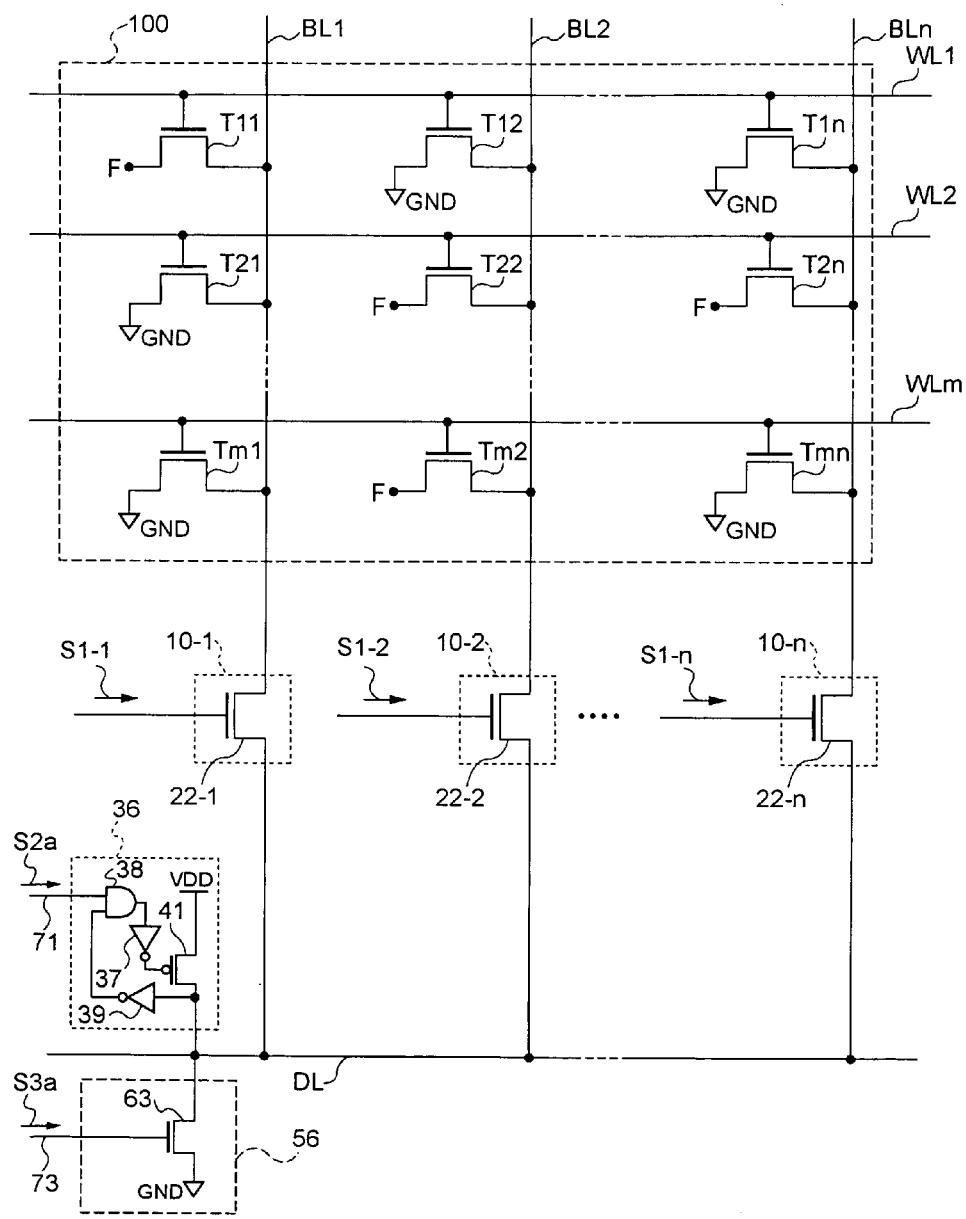
FIG. 15 is a circuit diagram schematically showing the configuration of a mask ROM, which is a semiconductor memory device according to a tenth embodiment of the present invention.

FIG. 15 is a circuit diagram schematically showing the configuration of a mask ROM, which is a semiconductor memory device according to a tenth embodiment of the present invention. The circuit configuration of the tenth embodiment is the same as that of the ninth embodiment described above with reference to FIG. 14, with the exception of the configuration of a precharge circuit 36, and a duplicate description thereof will thus be omitted.

The precharge circuit 36 includes a pMOS 41, an AND circuit 38, a first inverting circuit 37, and a second inverting circuit 39.

The first input signal S2a is inputted to the AND circuit 38. The voltage of the data line DL is also inputted to the AND circuit 38. An output signal from the AND circuit 38 is inputted to the gate of the pMOS 41 through the first inverting circuit 37. The source of the pMOS 41 is connected to the second voltage line which is at the VDD level and the drain thereof is connected to the data line DL. If the threshold voltage of the second inverting circuit 39 is set to VDD/2, the second inverting circuit 39 outputs a high-level signal when the voltage of the data line DL is lower than VDD/2, and a low-level signal when the voltage of the data line DL is higher than or equal to VDD/2.

A description will hereinafter be given on the assumption that the data line DL is at the GND level.

The first input signal S2a is set to the first active level. Also, the data line DL is at the GND level which is lower than VDD/2. As a result, the second inverting circuit 39 outputs a high-level signal, which is then inputted to the AND circuit 38. The AND circuit 38 outputs a high-level signal, too, because both of the two signals inputted thereto are high in level. This high-level signal from the AND circuit 38 is inverted into a low-level signal by the first inverting circuit 37 and then applied to the gate of the pMOS 41 to turn on the pMOS 41.

As the pMOS 41 is turned on, charges are supplied from the second voltage line to the data line DL. When the data line DL is in the floating state, the voltage thereof rises owing to the operation of the precharge circuit 36. If the voltage of the data line DL becomes higher than or equal to VDD/2 as a result of the rising, the output of the second inverting circuit 39 becomes low in level, thereby causing the output of the AND circuit 38 to become low in level. As a result, the pMOS 41 is turned off, so as to stop the supply of current to the data line DL. In this manner, in the precharge operation, the voltage of the data line DL does not rise to VDD and is stopped at VDD/2.

As described above, in this precharge circuit 36, the threshold voltage of the second inverting circuit 39 is preset to a low voltage level lower than VDD, thereby enabling the data line DL to be set to the low voltage level.

At the time that the precharge circuit 36 is turned on, the selector circuits 10-1 to 10-n are turned on, so that the voltages of the bit lines BL1 to BLn connected with the data line DL become VDD/2.

Consequently, the voltages of the respective bit lines BL1 to BLn are subject to the same variations as those in the fifth embodiment described above with reference to FIGS. 10A to 10C.

The precharge circuit of the tenth embodiment can reduce current consumption by precharging the data line DL to VDD/2 or less.

Further, the precharge circuit 36 of the tenth embodiment is applicable to the sixth to eighth embodiments, as well as to the ninth embodiment. By applying the precharge circuit 36 of the tenth embodiment to the sixth to eighth embodiments, it is possible to not only obtain the inherent effects of the respective embodiments, but also reduce current consumption by precharging the data line to VDD/2 or less.

In the above respective embodiments, the select level of the select signals has been disclosed to be a high level and the non-select level thereof has been disclosed to be a low level. Also, the active level of each of the first and second input signals has been disclosed to be a high level and the inactive level thereof has been disclosed to be a low level.

Which one of the select level and non-select level of the select signals is a high level may be determined according to a circuit design. For example, it is possible to set the select level to a low level and the non-select level to a high level by changing the conduction type of the nMOS used in each of the selector circuits 10-1 to 10-n to a pMOS or inputting each select signal to the gate of the nMOS through an inverting circuit. Furthermore, the configurations of the selector circuits, precharge circuits and pull-down circuits are not limited to those of the above-described embodiments. Although the preferred embodiments of the present invention have been disclosed for illustrative purposes, those skilled in the art will appreciate that various modifications, additions and substitutions are possible, without departing from the scope and spirit of the invention as disclosed in the accompanying claims.

This application is based on Japanese Patent Application No. 2005-029628 which is hereby incorporated by reference.

What is claimed is:

1. A semiconductor memory device comprising:
   a memory cell array including a plurality of memory cell transistors arranged in matrix form, each of the memory cell transistors having a first main electrode, a second main electrode and a control electrode, each of the memory cell transistors being written with a stored value depending on whether a connection is made between the first main electrode thereof and a first voltage line;
   a plurality of word lines connected to the control electrodes of the memory cell transistors of corresponding rows of the memory cell array, respectively;
   a plurality of bit lines connected to the second main electrodes of the memory cell transistors of corresponding columns of the memory cell array, respectively;
   a data line for selectively outputting voltages of the bit lines;
   a plurality of selector circuits, each of the selector circuits being installed between a corresponding one of the bit lines and the data line, each of the selector circuits electrically connecting the corresponding bit line with the data line when a select signal inputted thereto assumes a select level, and electrically isolating the corresponding bit line from the data line when the inputted select signal assumes a non-select level;
   at least one precharge circuit connected to a first input signal line, the first input signal line transferring a common first input signal having any one of a first active level and a first inactive level, the precharge circuit precharging the bit lines to a predetermined voltage level, the predetermined voltage level being different from a voltage level of the first voltage line; and
   at least one pull-down circuit connected to a second input signal line, the second input signal line transferring a common second input signal having any one of a second active level and a second inactive level, the pull-down circuit pulling the bit lines down to the voltage level of the first voltage line.

2. The semiconductor memory device as set forth in claim 1, wherein:
   the precharge circuit and the pull-down circuit are connected to each of the bit lines and are adapted to commonly receive the select signal inputted to one of the selector circuits connected to the same bit line;
   the precharge circuit is turned on, when the first input signal assumes the first active level and the select signal assumes the select level, to precharge the same bit line to the predetermined voltage level, the predetermined voltage level being the same as a voltage level of a second voltage line; and
   the pull-down circuit is turned on, when the second input signal assumes the second active level and the select signal assumes the select level, to pull the same bit line down to the voltage level of the first voltage line.

3. The semiconductor memory device as set forth in claim 1, wherein:
   the precharge circuit and the pull-down circuit are connected to each of the bit lines and are adapted to commonly receive the select signal inputted to one of the selector circuits connected to the same bit line;
   the precharge circuit is turned on, when the first input signal assumes the first active level and the select signal assumes the select level, to precharge the same bit line to the predetermined voltage level, the predetermined voltage level being the same as a voltage level of a second voltage line; and
   the pull-down circuit is turned on, when the second input signal assumes the second active level or the select signal assumes the non-select level, to pull the same bit line down to the voltage level of the first voltage line.

4. The semiconductor memory device as set forth in claim 1, wherein:
   the precharge circuit and the pull-down circuit are connected to each of the bit lines and the precharge circuit is adapted to receive the select signal inputted to one of the selector circuits connected to the same bit line;
   the precharge circuit is turned on, when the first input signal assumes the first active level and the select) signal assumes the select level, to precharge the same bit line to the predetermined voltage level, the predetermined voltage level being the same as a voltage level of a second voltage line; and
   the pull-down circuit is turned on, when the second input signal assumes the second active level, to pull the same bit line down to the voltage level of the first voltage line.

5. The semiconductor memory device as set forth in claim 1, wherein:
   the precharge circuit is connected to each of the bit lines and is adapted to receive the select signal inputted to one of the selector circuits connected to the same bit line;
   the pull-down circuit is connected to the data line;

the precharge circuit is turned on, when the first input signal assumes the first active level and the select signal assumes the select level, to precharge the same bit line to the predetermined voltage level, the predetermined voltage level being the same as a voltage level of a second voltage line; and the pull-down circuit is turned on, when the second input signal assumes the second active level, to pull down the data line and the same bit line electrically connected with the data line to the voltage level of the first voltage line.

6. The semiconductor memory device as set forth in claim 2, wherein the precharge circuit is turned on, only when the voltage of the same bit line is lower than the predetermined voltage level under the condition that the first input signal assumes the first active level and the select signal assumes the select level, to precharge the same bit line to the predetermined voltage level, the predetermined voltage level being lower than the voltage level of the second voltage line.

7. The semiconductor memory device as set forth in claim 3, wherein the precharge circuit is turned on, only when the voltage of the same bit line is lower than the predetermined voltage level under the condition that the first input signal assumes the first active level and the select signal assumes the select level, to precharge the same bit line to the predetermined voltage level, the predetermined voltage level being lower than the voltage level of the second voltage line.

8. The semiconductor memory device as set forth in claim 4, wherein the precharge circuit is turned on, only when the voltage of the same bit line is lower than the predetermined voltage level under the condition that the first input signal assumes the first active level and the select signal assumes the select level, to precharge the same bit line to the predetermined voltage level, the predetermined voltage level being lower than the voltage level of the second voltage line.

9. The semiconductor memory device as set forth in claim 5, wherein the precharge circuit is turned on, only when the voltage of the same bit line is lower than the predetermined voltage level under the condition that the first input signal assumes the first active level and the select signal assumes the select level, to precharge the same bit line to the predetermined voltage level, the predetermined voltage level being lower than the voltage level of the second voltage line.

10. The semiconductor memory device as set forth in claim 1, wherein:

the precharge circuit is connected to the data line;

the pull-down circuit is connected to each of the bit lines and is adapted to receive the select signal inputted to one of the selector circuits connected to the same bit line;

the precharge circuit is turned on, when the first input signal assumes the first active level, to precharge the data line and the same bit line electrically connected with the data line to the predetermined voltage level, the predetermined voltage level being the same as a voltage level of a second voltage line; and the pull-down circuit is turned on, when the second input signal assumes the second active level and the select signal assumes the select level, to pull the same bit line down to the voltage level of the first voltage line.

11. The semiconductor memory device as set forth in claim 1, wherein:

the precharge circuit is connected to the data line;

the pull-down circuit is connected to each of the bit lines and is adapted to receive the select signal inputted to one of the selector circuits connected to the same bit line;

the precharge circuit is turned on, when the first input signal assumes the first active level, to precharge the data line and the same bit line electrically connected with the data line to the predetermined voltage level, the predetermined voltage level being the same as a voltage level of a second voltage line; and the pull-down circuit is turned on, when the second input signal assumes the second active level or the select signal assumes the non-select level, to pull the same bit line down to the voltage level of the first voltage line.

12. The semiconductor memory device as set forth in claim 1, wherein:

the precharge circuit is connected to the data line;

the pull-down circuit is connected to each of the bit lines;

the precharge circuit is turned on, when the first input signal assumes the first active level, to precharge the data line and the same bit line electrically connected with the data line to the predetermined voltage level, the predetermined voltage level being the same as a voltage level of a second voltage line; and the pull-down circuit is turned on, when the second input signal assumes the second active level, to pull the same bit line down to the voltage level of the first voltage line.

13. The semiconductor memory device as set forth in claim 1, wherein:

the precharge circuit and the pull-down circuit are connected to the data line;

the precharge circuit is turned on, when the first input signal assumes the first active level, to precharge the data line and the same bit line electrically connected with the data line to the predetermined voltage level, the predetermined voltage level being the same as a voltage level of a second voltage line; and the pull-down circuit is turned on, when the second input signal assumes the second active level, to pull down the data line and the same bit line electrically connected with the data line to the voltage level of the first voltage line.

14. The semiconductor memory device as set forth in claim 10, wherein the precharge circuit is turned on, only when the voltage of the data line is lower than the predetermined voltage level under the condition that the first input signal assumes the first active level, to precharge the data line and the same bit line electrically connected with the data line to the predetermined voltage level, the predetermined voltage level being lower than the voltage level of the second voltage line.

15. The semiconductor memory device as set forth in claim 11, wherein the precharge circuit is turned on, only when the voltage of the data line is lower than the predetermined voltage level under the condition that the first input signal assumes the first active level, to precharge the data line and the same bit line electrically connected with the data line to the predetermined voltage level, the predetermined voltage level being lower than the voltage level of the second voltage line.

16. The semiconductor memory device as set forth in claim 12, wherein the precharge circuit is turned on, only when the voltage of the data line is lower than the predetermined voltage level under the condition that the first input signal assumes the first active level, to precharge the data line and the same bit line electrically connected with the data line to the predetermined voltage level, the predetermined voltage level being lower than the voltage level of the second voltage line.

17. The semiconductor memory device as set forth in claim 13, wherein the precharge circuit is turned on, only when the voltage of the data line is lower than the predetermined voltage level under the condition that the first input signal assumes the first active level, to precharge the data line and the same bit line electrically connected with the data line to the predetermined voltage level, the predetermined voltage level being lower than the voltage level of the second voltage line.

* * * * *